(12) United States Patent
Iwaya et al.

(10) Patent No.: US 9,556,513 B2
(45) Date of Patent: Jan. 31, 2017

(54) MOLDING, PRODUCTION METHOD THEREFOR, PART FOR ELECTRONIC DEVICES AND ELECTRONIC DEVICE

(75) Inventors: Wataru Iwaya, Tokyo (JP); Takeshi Kondo, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 0 days.

(21) Appl. No.: 13/818,050

(22) PCT Filed: Jul. 27, 2011

(86) PCT No.: PCT/JP2011/067046
§ 371 (c)(1),
(2), (4) Date: Apr. 5, 2013

(87) PCT Pub. No.: WO2012/023389
PCT Pub. Date: Feb. 23, 2012

(65) Prior Publication Data
US 2013/0202899 A1  Aug. 8, 2013

(30) Foreign Application Priority Data
Aug. 20, 2010  (JP) ................................. 2010-185633

(51) Int. Cl.
*C23C 14/48* (2006.01)
*B29C 59/14* (2006.01)
(Continued)

(52) U.S. Cl.
CPC ................. *C23C 14/48* (2013.01); *B05D 1/62* (2013.01); *B05D 7/04* (2013.01); *B29C 59/14* (2013.01);
(Continued)

(58) Field of Classification Search
CPC ......... B05D 1/62; B05D 2252/02; B05D 7/04; B29C 2059/147; B29C 59/14; C08J 2367/02; C08J 2433/12; C08J 2483/16; C08J 7/045; C08J 7/047; C08J 7/123; C23C 14/48; Y10T 428/31667
See application file for complete search history.

(56) References Cited

U.S. PATENT DOCUMENTS 5,143,747 A  9/1992  Matossian et al.
5,411,762 A  5/1995  Thebault et al.
(Continued)

FOREIGN PATENT DOCUMENTS

DE  10 2004 004 177 A1  9/2005
EP      0 285 870 A2     10/1988
(Continued)

OTHER PUBLICATIONS

Translation of JP 2007-237588, Morinaka, retrieved Feb. 3, 2015.*
(Continued)

*Primary Examiner* — Michael B Nelson
(74) *Attorney, Agent, or Firm* — Birch, Stewart, Kolasch & Birch, LLP

(57) ABSTRACT

The invention is a formed article including a gas barrier layer, the gas barrier layer including a surface layer part that is formed of a material that includes at least a carbon atom, an oxygen atom, and a silicon atom, the surface layer part having a carbon atom content rate of more than 0 and not more than 70%, an oxygen atom content rate of 10 to 70%, a nitrogen atom content rate of 0 to 35%, and a silicon atom content rate of 20 to 55%, based on a total content rate of carbon atoms, oxygen atoms, nitrogen atoms, and silicon atoms; a method for producing the formed article; an electronic device member including the formed article; and an electronic device comprising the electronic device member. The formed article of the invention exhibits an excellent gas barrier capability, excellent transparency, and excellent bending resistance. The method for producing a formed (Continued)

article of the invention can efficiently, safely, and conveniently produce the formed article of the invention. The electronic device member of the invention may suitably be used for electronic devices such as displays and solar cells.

6 Claims, 2 Drawing Sheets

(51) Int. Cl.
    *B05D 7/04*     (2006.01)
    *B05D 1/00*     (2006.01)
    *C08J 7/04*     (2006.01)
    *C08J 7/12*     (2006.01)

(52) U.S. Cl.
    CPC ............... *C08J 7/045* (2013.01); *C08J 7/047* (2013.01); *C08J 7/123* (2013.01); *B05D 2252/02* (2013.01); *B29C 2059/147* (2013.01); *C08J 2367/02* (2013.01); *C08J 2433/12* (2013.01); *C08J 2483/16* (2013.01); *Y10T 428/31667* (2015.04)

(56) References Cited

U.S. PATENT DOCUMENTS

| | | |
|---|---|---|
| 5,458,753 A | 10/1995 | Sato et al. |
| 5,907,382 A | 5/1999 | Kajiura et al. |
| 5,989,945 A | 11/1999 | Yudasaka et al. |
| 6,194,328 B1 | 2/2001 | Chen et al. |
| 6,251,981 B1 | 6/2001 | Tanaka et al. |
| 6,300,641 B1 * | 10/2001 | Koh .................. B29C 59/16 204/157.15 |
| 6,352,931 B1 | 3/2002 | Seta et al. |
| 6,416,817 B1 | 7/2002 | Rangwalla et al. |
| 6,828,381 B1 * | 12/2004 | Armbrust et al. ............ 525/100 |
| 2001/0018491 A1 | 8/2001 | Shiono et al. |
| 2002/0034885 A1 | 3/2002 | Shindo |
| 2002/0059899 A1 | 5/2002 | Seta et al. |
| 2002/0063830 A1 | 5/2002 | Callegari et al. |
| 2002/0102843 A1 | 8/2002 | Seta et al. |
| 2003/0165696 A1 | 9/2003 | Namiki et al. |
| 2003/0224611 A1 | 12/2003 | Seta et al. |
| 2003/0228475 A1 | 12/2003 | Komada |
| 2004/0046497 A1 | 3/2004 | Schaepkens et al. |
| 2004/0116555 A1 | 6/2004 | Naruse et al. |
| 2004/0146660 A1 | 7/2004 | Goodwin et al. |
| 2004/0253451 A1 * | 12/2004 | Kawashima et al. ...... 428/411.1 |
| 2004/0265554 A1 | 12/2004 | Miyadera et al. |
| 2005/0017633 A1 | 1/2005 | Miyadera |
| 2005/0082674 A1 | 4/2005 | Seta et al. |
| 2005/0202259 A1 | 9/2005 | Korevaar et al. |
| 2005/0287307 A1 | 12/2005 | Singh et al. |
| 2006/0017162 A1 | 1/2006 | Seta et al. |
| 2006/0232735 A1 | 10/2006 | Hokazono et al. |
| 2007/0026168 A1 | 2/2007 | Kishimoto et al. |
| 2007/0268089 A1 | 11/2007 | McKenzie et al. |
| 2008/0096014 A1 | 4/2008 | Griesser et al. |
| 2008/0305359 A1 | 12/2008 | Aiba et al. |
| 2008/0318067 A1 | 12/2008 | Itoh et al. |
| 2009/0021150 A1 | 1/2009 | Kim et al. |
| 2009/0022907 A1 | 1/2009 | Kim et al. |
| 2009/0110892 A1 | 4/2009 | Erlat et al. |
| 2009/0130463 A1 | 5/2009 | Albaugh et al. |
| 2009/0139564 A1 | 6/2009 | Miyaji et al. |
| 2009/0148633 A1 | 6/2009 | Inagaki et al. |
| 2009/0252975 A1 | 10/2009 | Lee et al. |
| 2010/0003482 A1 | 1/2010 | Fukuda |
| 2010/0003483 A1 | 1/2010 | Fukuda |
| 2010/0216264 A1 * | 8/2010 | Matsumoto et al. ............ 438/21 |
| 2011/0185948 A1 | 8/2011 | Uemura et al. |
| 2011/0189450 A1 * | 8/2011 | Hoshi et al. .................. 428/215 |
| 2011/0274933 A1 | 11/2011 | Hoshi et al. |
| 2012/0064321 A1 * | 3/2012 | Suzuki .................. C08J 7/123 428/219 |
| 2012/0101221 A1 | 4/2012 | Hoshi et al. |
| 2012/0108761 A1 | 5/2012 | Hoshi et al. |
| 2012/0208086 A1 | 8/2012 | Plieth et al. |
| 2012/0295120 A1 | 11/2012 | Nagamoto et al. |

FOREIGN PATENT DOCUMENTS

| | | | |
|---|---|---|---|
| EP | 2 410 005 A1 | | 1/2012 |
| EP | 2 412 522 A1 | | 2/2012 |
| EP | 2 615 144 A1 | | 7/2013 |
| JP | 62-220330 A | | 9/1987 |
| JP | 5-185568 A | | 7/1993 |
| JP | 6-64105 A | | 3/1994 |
| JP | 6-187833 A | | 7/1994 |
| JP | 7-292321 A | | 11/1995 |
| JP | 8-45452 A | | 2/1996 |
| JP | 8-57560 A | | 3/1996 |
| JP | 8-174748 A | | 7/1996 |
| JP | 8-302043 A | | 11/1996 |
| JP | 9-10687 A | | 1/1997 |
| JP | 9-26755 A | | 1/1997 |
| JP | 9-124807 A | | 5/1997 |
| JP | 10-244613 A | | 9/1998 |
| JP | 10-249990 A | | 9/1998 |
| JP | 10-305542 A | | 11/1998 |
| JP | 2000-246830 A | | 9/2000 |
| JP | 2000-254996 A | | 9/2000 |
| JP | 2000-260870 A | | 9/2000 |
| JP | 2000-338901 A | | 12/2000 |
| JP | 2000-340166 A | | 12/2000 |
| JP | 2001-119051 A | | 4/2001 |
| JP | 2002-18246 A | | 1/2002 |
| JP | 2002-105676 A | | 4/2002 |
| JP | 2003-8179 A | | 1/2003 |
| JP | 2003-118029 A | | 4/2003 |
| JP | 2003-154596 A | | 5/2003 |
| JP | 2003-525995 A | | 9/2003 |
| JP | 2003-347570 A | | 12/2003 |
| JP | 2004-119138 A | | 4/2004 |
| JP | 2004-527642 A | | 9/2004 |
| JP | 2004-530790 A | | 10/2004 |
| JP | 2004-322489 A | | 11/2004 |
| JP | 2004-352966 A | | 12/2004 |
| JP | 2005-88431 A | | 4/2005 |
| JP | 2005-104025 A | | 4/2005 |
| JP | 2005-119155 A | | 5/2005 |
| JP | 2005-119160 A | | 5/2005 |
| JP | 2005-169994 A | | 6/2005 |
| JP | 2005-231039 A | | 9/2005 |
| JP | 2005-240061 A | | 9/2005 |
| JP | 2005-537963 A | | 12/2005 |
| JP | 2006-35737 A | | 2/2006 |
| JP | 2006-52376 A | | 2/2006 |
| JP | 2006-70238 A | | 3/2006 |
| JP | 2006-123306 A | | 5/2006 |
| JP | 2006-123307 A | | 5/2006 |
| JP | 2006-192858 A | | 7/2006 |
| JP | 2006-264118 A | | 10/2006 |
| JP | 2007-237588 | * | 1/2007 |
| JP | 2007-22075 A | | 2/2007 |
| JP | 2007-42616 A | | 2/2007 |
| JP | 2007-65644 A | | 3/2007 |
| JP | 2007-237588 A | | 9/2007 |
| JP | 2007-528447 A | | 10/2007 |
| JP | 2007-283726 A | | 11/2007 |
| JP | 2008-15500 A | | 1/2008 |
| JP | 2008-504687 A | | 2/2008 |
| JP | 2008-49601 A | | 3/2008 |
| JP | 2008-62498 A | | 3/2008 |
| JP | 2008-174792 A | | 7/2008 |
| JP | 2008-204683 A | | 9/2008 |
| JP | 2008-235165 A | | 10/2008 |
| JP | 2008-246893 A | | 10/2008 |
| JP | 2008-246894 A | | 10/2008 |
| JP | 2008-270115 A | | 11/2008 |
| JP | 2009-110897 A | | 5/2009 |
| JP | 2009-199812 A | | 9/2009 |
| JP | 2009-252574 A | | 10/2009 |
| JP | 2009-287006 A | | 12/2009 |

(56) References Cited

FOREIGN PATENT DOCUMENTS

| | | |
|---|---|---|
| JP | 2011-718 A | 1/2011 |
| WO | WO 2006/015757 A1 | 2/2006 |
| WO | WO 2006/090602 A1 | 8/2006 |
| WO | WO 2007/040039 A1 | 4/2007 |
| WO | WO 2007/044181 A2 | 4/2007 |
| WO | WO 2008/096617 A1 | 8/2008 |
| WO | WO 2010/002182 A2 | 1/2010 |
| WO | WO 2010/021326 * | 2/2010 |
| WO | WO 2010/021326 A1 | 2/2010 |
| WO | WO 2010/024378 A1 | 3/2010 |
| WO | WO 2010/067857 A1 | 6/2010 |
| WO | WO 2010/107018 A1 | 9/2010 |
| WO | WO 2010/134609 A1 | 11/2010 |
| WO | WO 2010/134611 A1 | 11/2010 |

OTHER PUBLICATIONS

International Search Report for PCT/JP2011/067046 mailed on Aug. 23, 2011.
Written Opinion of the International Search Authority for PCT/JP2011/067046 mailed on Aug. 23, 2011 (Japanese).
Extended European Search Report issued Mar. 27, 2014, in European Patent Application No. 11818032.2.
Extended European Search Report for European Application No. 11765502.7 dated Aug. 29, 2013.
Extended European Search Report issued Feb. 17, 2014, in European Patent Application No. 11826800.2.
Extended European Search Report, dated Feb. 5, 2014, for European Application No. 11762771.1.
International Search Report for International Application No. PCT/JP2009/064457, dated Dec. 1, 2009.
International Search Report for International Application No. PCT/JP2010/052058 dated Jun. 1, 2010.
International Search Report for International Application No. PCT/JP2010/055064 dated May 11, 2010.
International Search Report for International Application No. PCT/JP2010/058668 dated Aug. 10, 2010.
International Search Report for International Application No. PCT/JP2011/051507 dated May 10, 2011 (with English translation).
International Search Report for International Application No. PCT/JP2011/057608 dated on Apr. 26, 2011.
International Search Report for International Application No. PCT/JP2011/057610 dated Jul. 5, 2011.
International Search Report for International Application No. PCT/JP2011/071203 dated Nov. 8, 2011.
International Search Report for International Application No. PCT/JP2011/071208 dated Nov. 8, 2011.
International Search Report for International Application No. PCT/JP2011/071353 dated Nov. 8, 2011.
International Search Report, dated Feb. 9, 2010 for International Application No. PCT/JP2009/070728.
Kobayashi et al., "Surface modification of silicone sheets and tubes using plasma-based ion implantation," Surface & Coatings Technology, vol. 201, 2007, pp. 8039-8042.
Nakagawara et al., "Moisture-resistant ZnO transparent conductive films with Ga heavy doping", Applied Physics Letters, vol. 89, 2006, pp. 091904-1-091904-3.
Schauer et al., "Luminescence as a tool for crosslinking determination in plasma polysilylenes prepared from organosilanes", Synthetic Metals, vol. 109, 2000, pp. 321-325.
United States Advisory Action for U.S. Appl. No. 13/128,348 dated Feb. 10, 2014.
United States Advisory Action for U.S. Appl. No. 13/055,274 dated Apr. 15, 2014.
United States Advisory Action for U.S. Appl. No. 13/144,856 dated Mar. 3, 2014.
United States Notice of Allowance for U.S. Appl. No. 13/823,688, dated Jun. 4, 2014.
United States Notice of Allowance issued Apr. 29, 2014, for U.S. Appl. No. 13/256,143.
United States Notice of Allowance issued Feb. 28, 2014, for U.S. Appl. No. 13/826,954.
United States Notice of Allowance, for U.S. Appl. No. 13/256,143, dated Jun. 24, 2014.
United States Office Action for U.S. Appl. No. 13/321,687 dated Oct. 8, 2013.
United States Office Action for U.S. Appl. No. 13/128,348 dated Feb. 14, 2013.
United States Office Action for U.S. Appl. No. 13/128,348 dated Sep. 13, 2013.
United States Office Action for U.S. Appl. No. 13/055,274 dated Apr. 16, 2013.
United States Office Action for U.S. Appl. No. 13/055,274 dated Nov. 7, 2013.
United States Office Action for U.S. Appl. No. 13/144,856 dated Mar. 15, 2013.
United States Office Action for U.S. Appl. No. 13/144,856 dated Oct. 18, 2013.
United States Office Action for U.S. Appl. No. 13/256,143 dated Aug. 6, 2013.
United States Office Action for U.S. Appl. No. 13/256,143 dated Nov. 21, 2013.
United States Office Action for U.S. Appl. No. 13/321,687 dated Jan. 15, 2014.
United States Office Action for U.S. Appl. No. 13/634,378 dated Feb. 19, 2014.
United States Office Action for U.S. Appl. No. 13/634,378, dated Jan. 15, 2014.
United States Office Action for U.S. Appl. No. 13/823,688 dated Nov. 8, 2013.
United States Office Action for U.S. Appl. No. 13/826,954 dated Nov. 7, 2013.
United States Office Action issued Feb. 25, 2014, for U.S. Appl. No. 13/823,688.
Bodo, P. et al., "Titanium deposition onto ion-bombarded and plasma-treated polydimethylsiloxane: Surface modification, interface and adhesion", Thin Solid Films, Elsevier-Sequoia, Feb. 1, 1986, vol. 136, No. 1, pp. 147-159.
Extended European Search Report issued Sep. 25, 2014, in European Patent Application No. 10756100.3.
Igarashi, A. et al., "Structure and morphology of diamond-like carbon coated on nylon 66/poly(phenylene ether) alloy", J. of Molecular Structure, Elsevier, Amsterdam, NL, vol. 788, No. 1-3, May 8, 2006, pp. 238-245.
Tsuji, H et al., "Improvement of polydimethylsiloxane guide tube for nerve regeneration treatment by carbon negative-ion implantation", Nuclear Instruments and Methods in Physics Research, Section B: Beam Interactions with Materials and Atoms, Elsevier, May 1, 2003, vol. 206, pp. 507-511.
Balabanov, S. et al., "Spectral distribution of UV range diffuse reflectivity for Si+ ion implanted polymers", J. of Physics: Conference Series, institute of Publishing, Bristol, vol. 113, No. 1, May 1, 2008.
Gelamo et al., "Infrared spectroscopy investigation of various plasma-deposited polymer films irradiated with 170 keV He+ ions," Nuclear Instruments and Methods in Physics Research B (2006), vol. 249, pp. 162-166.
Office Action issued Feb. 5, 2013, in U.S. Appl. No. 14/484,573.
Office Action issued Jun. 4, 2015, in U.S. Appl. No. 13/634,410.
Final Office Action issued Feb. 27, 2015, in U.S. Appl. No. 13/055,274.
Moriya et al., "Modification Effects on Ion-Implanted $SiO_2$ Spin-on-Glass," J. Electrochem. Soc. (May 1993), vol. 140, No. 5, pp. 1442-1450.
Office Action issued Jun. 8, 2015, in U.S. Appl. No. 13/144,856.
Office Action issued Nov. 4, 2015, in U.S. Appl. No. 13/321,687.
Final Office Action issued Jan. 15, 2016, in U.S. Appl. No. 14/484,573.
Office Action issued Dec. 2, 2015, in U.S. Appl. No. 13/144,856.
Office Action issued Oct. 7, 2015, in U.S. Appl. No. 13/634,410.

(56) References Cited

OTHER PUBLICATIONS

Nakano et al., "Effects of Si—C Bond Content on Film Properties of Organic Spin-on Glass," J. Electrochem. Soc. (Apr. 1995), vol. 142, No. 4, pp. 1303-1308.
Office Action issued Nov. 30, 2015, in U.S. Appl. No. 13/128,348.
Bechtold et al., "Polymerization and Polymers of Silicic Acid," Journal of Polymer Science: Polymer Chemistry Edition (1980), vol. 18, pp. 2823-2855.
Final Office Action issued Aug. 25, 2016, in U.S. Appl. No. 13/144,856.
Office Action issued Aug. 25, 2016, in U.S. Appl. No. 14/484,573.
Pivin et al., "Comparison of Ion Irradiation Effects in Silicon-Based Preceramic Thin Films," J. Am Ceram. Soc. (2000), vol. 83, No. 4, pp. 713-720.
Restriction Requirement issued Sep. 9, 2016, in U.S. Appl. No. 13/823,636.
Office Action issued Jan. 29, 2016, in U.S. Appl. No. 13/634,713.
Machine generated English translation of JP 2006-052376 A published Feb. 23, 2006.
Office Action issued May 28, 2015, in U.S. Appl. No. 13/128,348.
Final Office Action issued Jun. 10, 2016, in U.S. Appl. No. 13/128,348.
Final Office Action issued Jun. 8, 2016, in U.S. Appl. No. 13/634,410.
Final Office Action issued Jul. 22, 2016, in U.S. Appl. No. 13/634,713.

\* cited by examiner (a)

(b)

MOLDING, PRODUCTION METHOD THEREFOR, PART FOR ELECTRONIC DEVICES AND ELECTRONIC DEVICE

TECHNICAL FIELD

The invention relates to a formed article, a method for producing the same, an electronic device member that includes the formed article, and an electronic device that includes the electronic device member.

BACKGROUND ART

A polymer formed article (e.g., plastic film) that is inexpensive and exhibits excellent workability has been provided with a desired function, and used in various fields.

For example, a gas barrier plastic film that does not allow water vapor and oxygen to pass through has been used as a food/drug packaging film in order to suppress oxidation and denaturation of proteins, oils, fats, and the like to keep taste and freshness.

In recent years, use of a transparent plastic film as an electrode substrate instead of a glass plate has been studied for displays (e.g., liquid crystal display and electroluminescence (EL) display) in order to implement a reduction in thickness, a reduction in weight, an improvement in flexibility, and the like. However, since a plastic film tends to allow water vapor, oxygen, and the like to pass through as compared with a glass plate, a deterioration in elements provided in a display may easily occur.

In order to solve the above problem, Patent Document 1 proposes a flexible display substrate in which a transparent gas barrier layer formed of a metal oxide is stacked on a transparent plastic film.

However, since the transparent gas barrier layer formed of a metal oxide is stacked on the surface of the transparent plastic film by deposition, ion plating, sputtering, or the like, cracks may occur in the gas barrier layer when the substrate is rolled up or bent, so that the gas barrier capability may deteriorate.

Patent Document 2 discloses a gas barrier laminate that includes a plastic film, and a resin layer that contains a polyorganosilsesquioxane as the main component and is stacked on at least one side of the plastic film.

However, since it is necessary to further stack an inorganic compound layer in order to obtain a gas (e.g., oxygen and water vapor) barrier capability, the process becomes complex, the production cost increases, or toxic gas may be used during the production process.

Patent Document 3 discloses a method that forms a polysilazane film on at least one side of a film, and subjects the polysilazane film to a plasma treatment to produce a gas barrier film.

When using the method disclosed in Patent Document 3, however, a sufficient gas barrier capability cannot be obtained unless the thickness of the gas barrier layer is reduced to a micrometer level. For example, Patent Document 3 states that a water vapor transmission rate of 0.50 $g/m^2/day$ is obtained when the gas barrier layer has a thickness of 0.1 μm.

Patent Document 4 discloses a film obtained by mixing an acrylic resin into a polysilazane film. However, the film disclosed in Patent Document 4 does not exhibit a sufficient gas barrier capability.

RELATED-ART DOCUMENT

Patent Document

Patent Document 1: JP-A-2000-338901
Patent Document 2: JP-A-2006-123307
Patent Document 3: JP-A-2007-237588
Patent Document 4: JP-A-7-292321

SUMMARY OF THE INVENTION

Technical Problem

The invention was conceived in view of the above situation. An object of the invention is to provide a formed article that exhibits an excellent gas barrier capability, excellent transparency, and excellent bending resistance, a method for producing the same, an electronic device member that includes the formed article, and an electronic device that includes the electronic device member.

Solution to Problem

The inventors of the invention conducted extensive studies in order to achieve the above object. As a result, the inventors found that an excellent gas barrier capability, transparency, and bending resistance is achieved by a formed article including a gas barrier layer, the gas barrier layer including a surface layer part that is formed of a material that includes at least a carbon atom, an oxygen atom, and a silicon atom, the surface layer part having a carbon atom content rate of more than 0 and not more than 70%, an oxygen atom content rate of 10 to 70%, a nitrogen atom content rate of 0 to 35%, and a silicon atom content rate of 20 to 55%, based on the total content rate of carbon atoms, oxygen atoms, nitrogen atoms, and silicon atoms. The inventors also found that such a formed article can be conveniently and efficiently formed by implanting ions into a surface area of a layer that is included in a formed body and includes a polysilazane compound and an acrylic resin, the formed body including the layer that includes the polysilazane compound and the acrylic resin in its surface area. These findings have led to the completion of the invention.

A first aspect of the invention provides the following formed article (see (1) to (7)).

(1) A formed article including a gas barrier layer, the gas barrier layer including a surface layer part that is formed of a material that includes at least a carbon atom, an oxygen atom, and a silicon atom, the surface layer part having a carbon atom content rate of more than 0 and not more than 70%, an oxygen atom content rate of 10 to 70%, a nitrogen atom content rate of 0 to 35%, and a silicon atom content rate of 20 to 55%, based on a total content rate of carbon atoms, oxygen atoms, nitrogen atoms, and silicon atoms.

(2) The formed article according to (1), wherein the gas barrier layer is a layer that includes a polysilazane compound and an acrylic resin, and has a water vapor transmission rate at a temperature of 40° C. and a relative humidity of 90% of 1 $g/m^2/day$ or less.

(3) The formed article according to (2), wherein the gas barrier layer has an acrylic resin content of 0.1 to 70 mass % based on a total content of the polysilazane compound and the acrylic resin.

(4) The formed article according to any one of (1) to (3), wherein the gas barrier layer includes a layer that is obtained by implanting ions into a layer that includes a polysilazane compound and an acrylic resin.
(5) The formed article according to (4), wherein the ions are obtained by ionizing at least one gas selected from a group consisting of hydrogen, nitrogen, oxygen, argon, helium, neon, xenon, krypton, a silicon compound, and a hydrocarbon.
(6) The formed article according to (4) or (5), wherein the gas barrier layer includes a layer obtained by implanting ions into the layer that includes the polysilazane compound and the acrylic resin by a plasma ion implantation method.
(7) The formed article according to any one of (2) to (6), wherein the polysilazane compound is a perhydropolysilazane.

A second aspect of the invention provides the following method for producing a formed article (see (8) to (11)).
(8) A method for producing the formed article according to any one of (2) to (7), the method including implanting ions into a surface area of a layer that is included in a formed body and includes a polysilazane compound and an acrylic resin, the formed body including the layer that includes the polysilazane compound and the acrylic resin in its surface area.
(9) The method according to (8), including implanting ions of at least one gas selected from a group consisting of hydrogen, nitrogen, oxygen, argon, helium, xenon, neon, krypton, a silicon compound, and a hydrocarbon into the surface area of the layer that includes the polysilazane compound and the acrylic resin.
(10) The method according to (8) or (9), wherein the ions are implanted by a plasma ion implantation method.
(11) A method for producing the formed article according to any one of (2) to (7), the method including implanting ions into a layer that is included in a long formed body and includes a polysilazane compound and an acrylic resin while feeding the formed body in a given direction, the formed body including the layer that includes the polysilazane compound and the acrylic resin in its surface area.

A third aspect of the invention provides the following electronic device member (see (12)).
(12) An electronic device member including the formed article according to any one of (1) to (7).

A fourth aspect of the invention provides the following electronic device (see (13)).
(13) An electronic device including the electronic device member according to (12).

Advantageous Effects of the Invention

The formed article according to the first aspect of the invention exhibits an excellent gas barrier capability, excellent transparency, and excellent bending resistance. Therefore, the formed article may suitably be used as an electronic device member (e.g., solar cell backsheet) for flexible displays, solar cells, and the like.

The method for producing a formed article according to the second aspect of the invention can efficiently, safely, and conveniently produce the formed article according to the first aspect of the invention that exhibits an excellent gas barrier capability, excellent transparency, and excellent bending resistance. Moreover, an increase in area of the formed article can be easily achieved at low cost as compared with the case of depositing an inorganic film.

The electronic device member according to the third aspect of the invention exhibits an excellent gas barrier capability, excellent transparency, and excellent bending resistance, and may suitably be used for electronic devices such as displays and solar cells.

DESCRIPTION OF EMBODIMENTS

Figure 1:
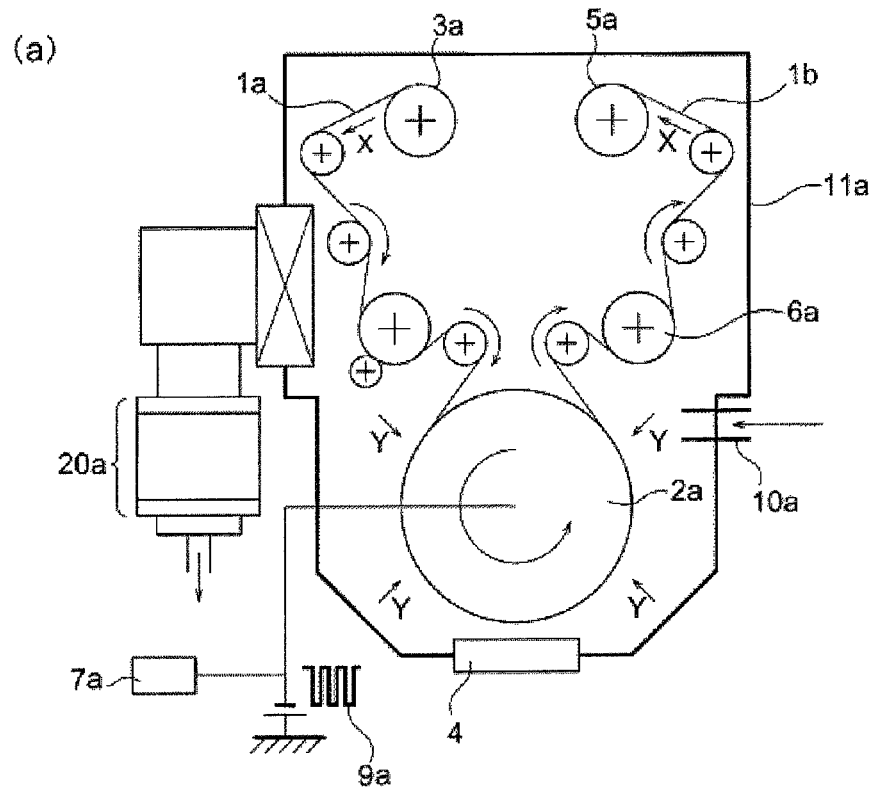
FIG. 1 is a view illustrating a schematic configuration of a plasma ion implantation system.
Figure 1:
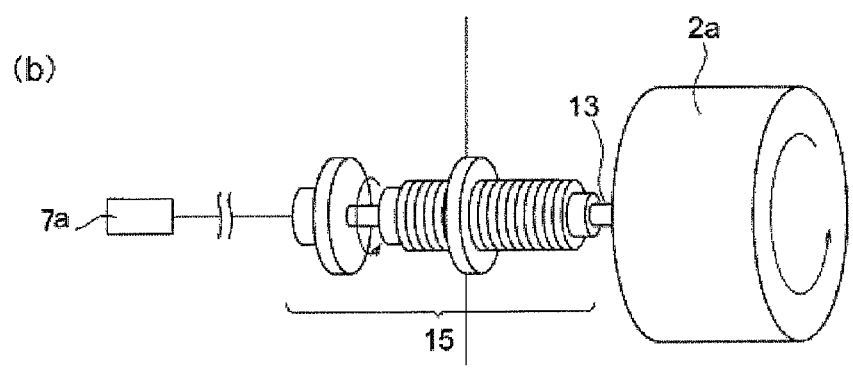

A formed article, a method for producing a formed article, an electronic device member, and an electronic device according to the embodiments of the invention are described in detail below.

1) Formed Article

A formed article according to one embodiment of the invention includes a gas barrier layer, the gas barrier layer including a surface layer part (i.e., an area having a depth of 0 to 10 nm from the surface) that is formed of a material that includes at least a carbon atom, an oxygen atom, and a silicon atom, the surface layer part having a carbon atom content rate of more than 0 and not more than 70%, an oxygen atom content rate of 10 to 70%, a nitrogen atom content rate of 0 to 35%, and a silicon atom content rate of 20 to 55%, based on the total content rate of carbon atoms, oxygen atoms, nitrogen atoms, and silicon atoms.

It is preferable that the gas barrier layer included in the formed article according to one embodiment of the invention be a layer that includes a polysilazane compound and an acrylic resin.

When the gas barrier layer included in the formed article according to one embodiment of the invention is a layer that includes a polysilazane compound and an acrylic resin, the carbon atom content rate, the oxygen atom content rate, the nitrogen atom content rate, and the silicon atom content rate in the gas barrier layer are similar to those (compositional ratio) when mixing the acrylic resin and the polysilazane compound in a given ratio. Specifically, the formed article according to one embodiment of the invention is a structure in which the polysilazane compound exhibits a gas barrier capability via conversion in the outermost area, and the acrylic resin provides the inner area of the formed article with flexibility.

It is preferable that the inner area (i.e., an area having a depth of 20 to 150 nm from the surface) of the gas barrier layer have a carbon atom content rate of 35 to 60%, a nitrogen atom content rate of 0 to 10%, an oxygen atom content rate of 15 to 70% (more preferably 15 to 30%), and a silicon atom content rate of 15 to 30%.

When the gas barrier layer included in the formed article according to one embodiment of the invention is a layer that includes a polysilazane compound and an acrylic resin, the gas barrier layer has a carbon atom content rate, an oxygen atom content rate, a nitrogen atom content rate, and a silicon atom content rate as described below.

(α) When the content of the acrylic resin in the gas barrier layer is 0.1 to 10 mass % based on the total content (=100 mass %) of the polysilazane compound and the acrylic resin in the gas barrier layer, the inner area (i.e., an area having a depth of 20 to 150 nm from the surface) of the gas barrier layer has a carbon atom content rate of 0 to 5%, an oxygen atom content rate of 50 to 75%, a nitrogen atom content rate of 0 to 5%, and a silicon atom content rate of 20 to 40%, based on the total content rate of carbon atoms, oxygen atoms, nitrogen atoms, and silicon atoms, and the surface layer part (i.e., an area having a depth of 0 to 10 nm from the surface) has a carbon atom content rate of more than 0 and not more than 70%, an oxygen atom content rate of 10 to 70%, a nitrogen atom content rate of 0 to 35%, and a silicon atom content rate of 20 to 55%, based on the total content rate of carbon atoms, oxygen atoms, nitrogen atoms, and silicon atoms.

(β) When the content of the acrylic resin in the gas barrier layer is more than 10 to not more than 40 mass % based on the total content (=100 mass %) of the polysilazane compound and the acrylic resin in the gas barrier layer, the inner area (i.e., an area having a depth of 20 to 150 nm from the surface) of the gas barrier layer has a carbon atom content rate of 0 to 40%, an oxygen atom content rate of 20 to 70%, a nitrogen atom content rate of 0 to 10%, and a silicon atom content rate of 20 to 40%, based on the total content rate of carbon atoms, oxygen atoms, nitrogen atoms, and silicon atoms, and the surface layer part (i.e., an area having a depth of 0 to 10 nm from the surface) has a carbon atom content rate of more than 0 and not more than 70%, an oxygen atom content rate of 10 to 70%, a nitrogen atom content rate of 0 to 35%, and a silicon atom content rate of 20 to 55%, based on the total content rate of carbon atoms, oxygen atoms, nitrogen atoms, and silicon atoms.

(γ) When the content of the acrylic resin in the gas barrier layer is more than 40 to not more than 70 mass % based on the total content (=100 mass %) of the polysilazane compound and the acrylic resin in the gas barrier layer, the inner area (i.e., an area having a depth of 20 to 150 nm from the surface) of the gas barrier layer has a carbon atom content rate of 30 to 70%, an oxygen atom content rate of 10 to 50%, a nitrogen atom content rate of 0 to 10%, and a silicon atom content rate of 10 to 40%, based on the total content rate of carbon atoms, oxygen atoms, nitrogen atoms, and silicon atoms, and the surface layer part (i.e., an area having a depth of 0 to 10 nm from the surface) has a carbon atom content rate of more than 0 and not more than 70%, an oxygen atom content rate of 10 to 70%, a nitrogen atom content rate of 0 to 35%, and a silicon atom content rate of 20 to 55%, based on the total content rate of carbon atoms, oxygen atoms, nitrogen atoms, and silicon atoms.

Polysilazane Compound

The polysilazane compound used in connection with the invention is a polymer compound that includes a repeating unit that includes an —Si—N— bond (silazane bond) in its molecule. The polysilazane compound is preferably a compound that includes a repeating unit represented by the following formula (1).

[Chemical Formula 1]

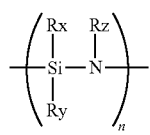

(1)

The number average molecular weight of the polysilazane compound is not particularly limited, but is preferably 100 to 50,000.

Note that n in the formula (1) is an arbitrary natural number.

Rx, Ry, and Rz independently represent a hydrogen atom or a non-hydrolyzable group such as a substituted or unsubstituted alkyl group, a substituted or unsubstituted cycloalkyl group, a substituted or unsubstituted alkenyl group, a substituted or unsubstituted aryl group, or an alkylsilyl group.

Examples of the substituted or unsubstituted alkyl group include alkyl groups having 1 to 10 carbon atoms (e.g., methyl group, ethyl group, n-propyl group, isopropyl group, n-butyl group, isobutyl group, sec-butyl group, t-butyl group, n-pentyl group, isopentyl group, neopentyl group, n-hexyl group, n-heptyl group, and n-octyl group).

Examples of the substituted or unsubstituted cycloalkyl group include cycloalkyl groups having 3 to 10 carbon atoms (e.g., cyclobutyl group, cyclopentyl group, cyclohexyl group, and cycloheptyl group).

Examples of the substituted or unsubstituted alkenyl group include alkenyl groups having 2 to 10 carbon atoms (e.g., vinyl group, 1-propenyl group, 2-propenyl group, 1-butenyl group, 2-butenyl group, and 3-butenyl group).

Examples of a substituent that may substitute the alkyl group, the cycloalkyl group, and the alkenyl group include halogen atoms such as a fluorine atom, a chlorine atom, a bromine atom, and an iodine atom; a hydroxyl group; a thiol group; an epoxy group; a glycidoxy group; a (meth)acryloyloxy group; substituted or unsubstituted aryl groups such as a phenyl group, a 4-methylphenyl group, and a 4-chlorophenyl group; and the like.

Examples of the unsubstituted aryl group include aryl groups having 6 to 10 carbon atoms (e.g., phenyl group, 1-naphthyl group, and 2-naphthyl group).

Examples of a substituent that may substitute the aryl group include halogen atoms such as a fluorine atom, a chlorine atom, a bromine atom, and an iodine atom; alkyl groups having 1 to 6 carbon atoms, such as a methyl group and an ethyl group; alkoxy groups having 1 to 6 carbon atoms, such as a methoxy group and an ethoxy group; a nitro group; a cyano group; a hydroxyl group; a thiol group; an epoxy group; a glycidoxy group; a (meth)acryloyloxy group; substituted or unsubstituted aryl groups such as a phenyl group, a 4-methylphenyl group, and a 4-chlorophenyl group; and the like.

Examples of the alkylsilyl group include a trimethylsilyl group, a triethylsilyl group, a triisopropylsilyl group, a tri-t-butylsilyl group, a methyldiethylsilyl group, a dimethylsilyl group, a diethylsilyl group, a methylsilyl group, an ethylsilyl group, and the like.

Among these, a hydrogen atom, an alkyl group having 1 to 6 carbon atoms, or a phenyl group is preferable as Rx, Ry, and Rz. A hydrogen atom is particularly preferable as Rx, Ry, and Rz.

The polysilazane compound that includes the repeating unit represented by the formula (1) may be an inorganic polysilazane in which Rx, Ry, and Rz represent a hydrogen atom, or an organic polysilazane in which at least one of Rx, Ry, and Rz does not represent a hydrogen atom.

Examples of the inorganic polysilazane include a perhydropolysilazane that has a linear structure that includes a repeating unit represented by the following formula, has a molecular weight of 690 to 2000, and includes three to ten $SiH_3$ groups in one molecule (see JP-B-63-16325),

[Chemical Formula 2]

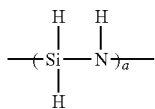

wherein a is an arbitrary natural number; a perhydropolysilazane that has a linear structure and a branched structure, and includes a repeating unit represented by the following formula (A),

[Chemical Formula 3]

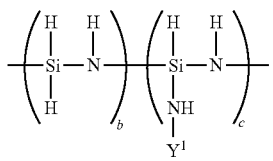
(A)

wherein b and c are arbitrary natural numbers, and $Y^1$ represents a hydrogen atom or a group represented by the following formula (B),

[Chemical Formula 4]

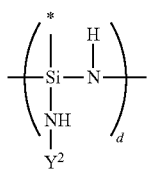
(B)

wherein d is an arbitrary natural number, * indicates the bonding position, and $Y^2$ represents a hydrogen atom or a group represented by the formula (B);
a perhydropolysilazane that has a linear structure, a branched structure, and a cyclic structure in its molecule, and includes the perhydropolysilazane structure represented by the following formula (C);

[Chemical Formula 5]

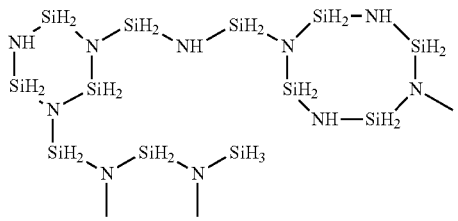
(C)

and the like.

Examples of the organic polysilazane include
(i) a polysilazane that includes a repeating unit represented by —(Rx'SiHNH)— (wherein Rx' represents a substituted or unsubstituted alkyl group, a substituted or unsubstituted cycloalkyl group, a substituted or unsubstituted alkenyl group, a substituted or unsubstituted aryl group, or an alkylsilyl group (hereinafter the same)), and has a cyclic structure having a degree of polymerization of 3 to 5, (ii) a polysilazane that includes a repeating unit represented by —(Rx'SiHNRz')— (wherein Rz' represents a substituted or unsubstituted alkyl group, a substituted or unsubstituted cycloalkyl group, a substituted or unsubstituted alkenyl group, a substituted or unsubstituted aryl group, or an alkylsilyl group), and has a cyclic structure having a degree of polymerization of 3 to 5, (iii) a polysilazane that includes a repeating unit represented by —(Rx'Ry'SiNH)— (wherein Ry' represents a substituted or unsubstituted alkyl group, a substituted or unsubstituted cycloalkyl group, a substituted or unsubstituted alkenyl group, a substituted or unsubstituted aryl group, or an alkylsilyl group), and has a cyclic structure having a degree of polymerization of 3 to 5, (iv) a polyorgano(hydro)silazane that includes a structure represented by the following formula in its molecule,

[Chemical Formula 6]

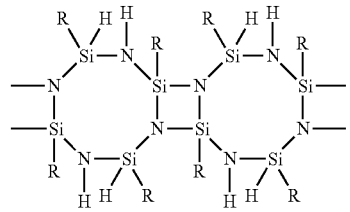

$R = CH_3$ (v) a polysilazane that includes a repeating unit represented by the following formula,

[Chemical Formula 7]

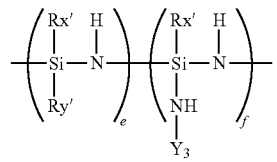

wherein Rx' and Ry' are the same as defined above, e and f are arbitrary natural numbers, and $Y^3$ represents a hydrogen atom or a group represented by the following formula (E),

[Chemical Formula 8]

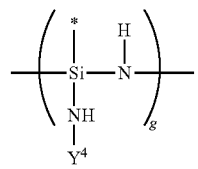
(E)

wherein g is an arbitrary natural number, * indicates the bonding position, and $Y^4$ represents a hydrogen atom or a group represented by the formula (E), and the like.

The above organic polysilazanes may be produced by a known method. For example, the above organic polysilazanes may be produced by reacting ammonia or a primary amine with a reaction product of a substituted or unsubstituted halogenosilane compound represented by the following formula (2) and a secondary amine.

[Chemical Formula 9]

$$R^1{}_{4-m}SiX_m \quad (2)$$

wherein m is 2 or 3, X represents a halogen atom, and $R^1$ represents a substituent that substitutes Rx, Ry, Rz, Rx', Ry', or Rz'.

The secondary amine, ammonia, and the primary amine may be appropriately selected depending on the structure of the target polysilazane compound.

A modified polysilazane may also be used as the polysilazane compound. Examples of the modified polysilazane include a polymetallosilazane that includes a metal atom (which may be crosslinked), a polysiloxazane that includes a repeating unit represented by $(SiH_2)_g(NH)_h)$ and a repeating unit represented by $(SiH_2)_iO$ (wherein g, h, and i are independently 1, 2, or 3) (see JP-A62-195024), a polyborosilazane produced by reacting a polysilazane with a boron compound (see JP-A-2-84437), a polymetallosilazane produced by reacting a polysilazane with a metal alkoxide (see JP-A-63-81122, for example), an inorganic silazane polymer and a modified polysilazane (see JP-A-1-138108, for example), a copolymer silazane produced by introducing an organic component into a polysilazane (JP-A-2-175726, for example), a low-temperature ceramic polysilazane obtained by adding a ceramic-forming catalyst compound to a polysilazane (see JP-A-5-238827, for example), a silicon alkoxide-addition polysilazane (see JP-A-5-238827), a glycidol-addition polysilazane (see JP-A-6-122852), an acetylacetonato complex-addition polysilazane (see JP-A-6-306329), a metal carboxylate-addition polysilazane (see JP-A-6-299118, for example), a polysilazane composition produced by adding an amine and/or an acid to the above polysilazane or modified polysilazane (see JP-A-9-31333), a modified polysilazane produced by adding an alcohol (e.g., methanol) or hexamethyldisilazane to the end nitrogen (N) atom of a perhydropolysilazane (see JP-A-5-345826 and JP-A-4-63833), and the like.

Among these, a perhydropolysilazane in which Rx, Ry, and Rz represent a hydrogen atom is preferable as the polysilazane compound from the viewpoint of availability and a capability to form an ion-implanted layer that exhibits an excellent gas barrier capability.

A product commercially available as a glass coating material or the like may be used directly as the polysilazane compound.

Acrylic Resin

The gas barrier layer included in the formed article according to one embodiment of the invention includes at least one acrylic resin in addition to the polysilazane compound. A gas barrier formed article that exhibits excellent bending resistance and excellent transparency can be obtained by incorporating the acrylic resin in the gas barrier layer.

The acrylic resin used in connection with the invention is a (co)polymer that includes at least a repeating unit derived from a (meth)acrylic acid-based compound in its molecule. Note that the term "(co)polymer" used herein refers to a homopolymer or a copolymer (hereinafter the same). The term "(meth)acrylic" used herein refers to acrylic or methacrylic (hereinafter the same).

Examples of the acrylic resin include (i) a homopolymer of a (meth)acrylic acid-based compound, (ii) a copolymer of two or more (meth)acrylic acid-based compounds, and (iii) a copolymer of a (meth)acrylic acid-based compound and an additional functional monomer. When the acrylic resin is the copolymer (iii), it is preferable that the content of a repeating unit derived from a (meth)acrylic acid-based compound in the acrylic resin be 50 mol % or more based on the total repeating units.

These (co)polymers may be used either alone or in combination as the acrylic resin.

Examples of the (meth)acrylic acid-based compound include (meth)acrylic acid esters, fluorinated esters of (meth)acrylic acid, hydroxyalkyl esters of (meth)acrylic acid, (meth)acrylamides, aminoalkyl esters of (meth)acrylic acid, glycidyl esters of (meth)acrylic acid, (meth)acrylic acid, and the like. Among these, (meth)acrylate are preferable, and methacrylate are more preferable.

An alkyl(meth)acrylate in which the alkyl group has 1 to 20 carbon atoms is preferable as the (meth)acrylic acid esters. An alkyl(meth)acrylate in which the alkyl group has 1 to 10 carbon atoms is more preferable as the (meth)acrylic acid ester.

Specific examples of the (meth)acrylic acid esters include methyl(meth)acrylate, ethyl (meth)acrylate, t-butyl (meth)acrylate, n-propyl (meth)acrylate, isopropyl (meth)acrylate, n-butyl (meth)acrylate, isobutyl (meth)acrylate, t-butyl (meth)acrylate, n-pentyl (meth)acrylate, n-hexyl (meth)acrylate, n-heptyl (meth)acrylate, n-octyl (meth)acrylate, n-decyl (meth)acrylate, 2-ethylhexyl (meth)acrylate, cyclohexyl (meth)acrylate, phenyl (meth)acrylate, benzyl (meth)acrylate, phenylethyl (meth)acrylate, and the like.

Examples of the fluorinated esters of (meth)acrylic acid include perfluoro-t-butyl (meth)acrylate, perfluoroisopropyl (meth)acrylate, hexafluoro-2-propyl (meth)acrylate, trifluoroethyl (meth)acrylate, and the like.

Examples of the hydroxyalkyl esters of (meth)acrylic acid include 2-hydroxyethyl (meth)acrylate, 2-hydroxypropyl (meth)acrylate, and the like.

Examples of the (meth)acrylamides include (meth)acrylamide, N-methyl(meth)acrylamide, N-methylol(meth)acrylamide, N,N-dimethylol(meth)acrylamide, N-methoxymethyl(meth)acrylamide, N-phenyl(meth)acrylamide, and the like.

Examples of the amino alkyl esters of (meth)acrylic acid include N,N-diethylaminoethyl (meth)acrylate and the like.

Examples of the glycidyl ester of (meth)acrylic acid include glycidyl (meth)acrylate and the like.

The additional functional monomer is not particularly limited as long as the additional functional monomer is copolymerizable with the (meth)acrylic acid-based compound. Examples of the additional functional monomer include epoxy group-containing monomers such as allyl glycidyl ether; monomers that include a sulfonic acid group or a salt thereof, such as styrenesulfonic acid, vinylsulfonic acid, and salts thereof (e.g., sodium salt, potassium salt, and ammonium salt); monomers that include a carboxyl group or a salt thereof, such as crotonic acid, itaconic acid, acrylic acid, maleic acid, fumaric acid, and salts thereof (e.g., sodium salt, potassium salt, and ammonium salt); monomers that include an anhydride such as maleic anhydride and itaconic anhydride; vinyl isocyanate; allyl isocyanate; styrene; vinyl methyl ether; vinyl ethyl ether; vinyltrisalkoxysilanes; alkyl monomaleates; alkyl monofumarates; (meth)acrylonitrile; alkyl monoitaconates; vinylidene chloride; vinyl acetate; vinyl chloride; and the like.

These monomers may be used either alone or in combination.

The homopolymer (i) may be obtained by polymerizing one (meth)acrylic acid-based compound, the copolymer (ii)

may be obtained by copolymerizing a monomer mixture that includes two or more (meth)acrylic acid-based compounds, and the copolymer (iii) may be obtained by copolymerizing a monomer mixture that includes a (meth)acrylic acid-based compound and an additional functional monomer.

The (co)polymerization method is not particularly limited. For example, a solution polymerization method, an emulsion polymerization method, a suspension polymerization method, or the like may be used.

It is also possible to use an acrylic resin that is obtained by mixing a (meth)acrylate (co)polymer with a crosslinking agent, and at least partially crosslinking the (meth)acrylate (co)polymer.

Examples of the crosslinking agent include isocyanate crosslinking agents such as tolylene diisocyanate, hexamethylene diisocyanate, and adducts thereof; epoxy crosslinking agents such as ethylene glycol glycidyl ether; aziridine crosslinking agents such as hexa[1-(2-methyl)-aziridinyl] triphosphatriazine; chelate crosslinking agents such as aluminum chelates; and the like.

The crosslinking agent is used in an amount of 0.01 to 10 parts by mass, and preferably 0.05 to 5 parts by mass, based on 100 parts by mass (solid content) of the (meth)acrylate (co)polymer. The above crosslinking agents may be used either alone or in combination.

It is preferable to use the homopolymer (i) of a (meth) acrylic acid-based compound or the copolymer (ii) of two or more (meth)acrylic acid-based compounds as the acrylic resin since a layer-forming solution used to form an polysilazane compound/acrylic resin-containing layer (described later) rarely gels before forming a film so that a film can be easily formed, and the homopolymer (i) or the copolymer (ii) exhibits excellent mutual solubility with the polysilazane compound. It is more preferable to use a homopolymer of an (meth)acrylic acid ester or a copolymer of two or more (meth)acrylic acid ester.

The weight average molecular weight of the acrylic resin used in connection with the invention is preferably 1000 to 1,000,000, and more preferably 100,000 to 1,000,000.

The total content of the polysilazane compound and the acrylic resin in the gas barrier layer is preferably 50 mass % or more, and more preferably 70 mass % or more, from the viewpoint of forming an ion-implanted layer that exhibits an excellent gas barrier capability and the like.

The content of the acrylic resin in the gas barrier layer is preferably 0.1 to 70 mass %, more preferably 30 to 70 mass %, and still more preferably 40 to 60 mass %, based on the total content (100 mass %) of the polysilazane compound and the acrylic resin, when attaching importance to flexibility and transparency. The content of the acrylic resin in the gas barrier layer is preferably 50 mass % or less, and more preferably 10 mass % or less, based on the total content (100 mass %) of the polysilazane compound and the acrylic resin, when attaching importance to the gas barrier capability.

The gas barrier layer may include an additional component other than the polysilazane compound and the acrylic resin as long as the object of the invention is not impaired. Examples of the additional component include an additional polymer, a curing agent, an aging preventive, a light stabilizer, a flame retardant, a filler, a pigment, a leveling agent, an antifoaming agent, an antistatic agent, a UV absorber, a pH-adjusting agent, a dispersant, a surface modifier, a plasticizer, a siccative, an antirunning agent, and the like.

The formed article according to one embodiment of the invention has a water vapor transmission rate at a temperature of 40° C. and a relative humidity of 90% of 1 g/m$^2$/day or less, preferably 0.5 g/m$^2$/day or less, and more preferably 0.1 g/m$^2$/day or less (i.e., the formed article exhibits an excellent gas barrier capability). Note that the gas (e.g., water vapor) transmission rate of the formed article may be measured using a known gas transmission rate measurement system.

The formed article according to one embodiment of the invention include a gas barrier layer (hereinafter may be referred to as "ion-implanted layer") obtained by implanting ions into a layer that includes a polysilazane compound and an acrylic resin (hereinafter may be referred to as "polysilazane compound/acrylic resin-containing layer").

It is particularly preferable that the formed article according to one embodiment of the invention include a gas barrier layer that includes a polysilazane compound and an acrylic resin, has a water vapor transmission rate at a temperature of 40° C. and a relative humidity of 90% of 1 g/m$^2$/day or less, and includes the ion-implanted layer.

The polysilazane compound/acrylic resin-containing layer may be formed by an arbitrary method. For example, the polysilazane compound/acrylic resin-containing layer may be formed by applying a layer-forming solution that includes at least one polysilazane compound, at least one acrylic resin, an optional additional component, a solvent, and the like to an appropriate base layer to form a film, and appropriately drying the film.

The polysilazane compound and the acrylic resin used to form the polysilazane compound/acrylic resin-containing layer may be the same as described above.

It is preferable to use a solvent that stably dissolves the polysilazane compound and the acrylic resin as the solvent used for the layer-forming solution. Examples of such a solvent include xylene; toluene; esters such as butyl carbitol acetate, n-butyl acetate, and ethyl acetate; glycol ethers such as cellosolve and cellosolve acetate; ketones such as acetone and methyl ethyl ketone; and the like.

Two or more solvents may be used in combination in order to adjust the solubility of the acrylic resin-added polysilazane compound, and the evaporation rate of the solvent.

The content of the solvent in the layer-forming solution is determined depending on the coating method, the type of the polysilazane compound, and the like, but is normally 5 to 99 mass %, and preferably 5 to 60 mass %.

A spin coater, a knife coater, a gravure coater, or the like may be used as the coater for applying the layer-forming solution.

It is preferable to heat the resulting film in order to dry the film, and improve the gas barrier capability of the resulting formed article. In this case, the film is heated at 80 to 150° C. for several tens of seconds to several tens of minutes.

The polysilazane compound is thus crosslinked, condensed, optionally oxidized, hydrolyzed, and cured to form a ceramic phase, while the acrylic resin is thermally softened. It is thus possible to obtain a dense film in which a ceramic phase that mainly includes an Si—N bond or an Si—O bond and an organic moiety that includes an acrylic phase form a complex at a microstructure level (as compared with a composite material that includes an inorganic filler or the like).

The thickness of the polysilazane compound/acrylic resin-containing layer is not particularly limited, but is normally 20 nm to 100 µm, preferably 30 nm to 500 nm, and more preferably 40 nm to 200 nm.

According to one embodiment of the invention, a formed article that exhibits a sufficient gas barrier capability can be obtained even if the polysilazane compound/acrylic resin-containing layer has a thickness at a nanometer level.

The ion-implanted layer included in the formed article according to one embodiment of the invention is not particularly limited as long as the ion-implanted layer has been obtained by implanting ions into the polysilazane compound/acrylic resin-containing layer.

Examples of the ions implanted include ions of a rare gas (e.g., argon, helium, neon, krypton, and xenon), a fluorocarbon, hydrogen, nitrogen, oxygen, carbon dioxide, chlorine, fluorine, sulfur, a silicon compound, and a hydrocarbon; ions of a conductive metal (e.g., gold, silver, copper, platinum, nickel, palladium, chromium, titanium, molybdenum, niobium, tantalum, tungsten, and aluminum); and the like.

Among these, ions obtained by ionizing at least one gas selected from the group consisting of hydrogen, nitrogen, oxygen, argon, helium, neon, xenon, krypton, a silicon compound, and a hydrocarbon are preferable due to ease of implantation and a capability to form an ion-implanted layer that exhibits an excellent gas barrier capability and excellent transparency.

Examples of the silicon compound include silane ($SiH_4$) and organosilicon compounds.

Examples of the organosilicon compounds include tetraalkoxysilanes such as tetramethoxysilane, tetraethoxysilane, tetra-n-propoxysilane, tetraisopropoxysilane, tetra-n-butoxysilane, and tetra-t-butoxysilane; substituted or unsubstituted alkylalkoxysilanes such as dimethyldimethoxysilane, dimethyldiethoxysilane, diethyldimethoxysilane, methyltriethoxysilane, ethyltrimethoxysilane, and (3,3,3-trifluoropropyl)trimethoxysilane;
arylalkoxysilanes such as diphenyldimethoxysilane and phenyltriethoxysilane; disiloxanes such as hexamethyldisiloxane (HMDSO); aminosilanes such as bis(dimethylamino)dimethylsilane, bis(dimethylamino)methylvinylsilane, bis(ethylamino)dimethylsilane, diethylaminotrimethylsilane, dimethylaminodimethylsilane, tetrakisdimethylaminosilane, and tris(dimethylamino)silane; silazanes such as hexamethyldisilazane, hexamethylcyclotrisilazane, heptamethyldisilazane, nonamethyltrisilazane, octamethylcyclotetrasilazane, and tetramethyldisilazane; cyanatosilanes such as tetraisocyanatosilane; halogenosilanes such as triethoxyfluorosilane; alkenylsilanes such as diallyldimethylsilane and allyltrimethylsilane; substituted or unsubstituted alkylsilanes such as di-t-butylsilane, 1,3-disilabutane, bis(trimethylsilyl)methane, tetramethylsilane, tris(trimethylsilyl)methane, tris(trimethylsilyl)silane, and benzyltrimethylsilane; silylalkynes such as bis(trimethylsilyl)acetylene, trimethylsilylacetylene, and 1-(trimethylsilyl)-1-propyne;
silylalkenes such as 1,4-bistrimethylsilyl-1,3-butadiene and cyclopentadienyltrimethylsilane; arylalkylsilanes such as phenyldimethylsilane and phenyltrimethylsilane; alkynylalkylsilanes such as propargyltrimethylsilane; alkenylalkylsilanes such as vinyltrimethylsilane; disilanes such as hexamethyldisilane; siloxanes such as octamethylcyclotetrasiloxane, tetramethylcyclotetrasiloxane, and hexamethylcyclotetrasiloxane; N,O-bis(trimethylsilyl)acetamide; bis(trimethylsilyl)carbodiimide; and the like.

Examples of the hydrocarbon include alkanes such as methane, ethane, propane, butane, pentane, and hexane; alkenes such as ethylene, propylene, butene, and pentene; alkadienes such as pentadiene and butadiene; alkynes such as acetylene and methylacetylene; aromatic hydrocarbons such as benzene, toluene, xylene, indene, naphthalene, and phenanthrene; cycloalkanes such as cyclopropane and cyclohexane; cycloalkenes such as cyclopentene and cyclohexene; and the like.

These compounds (ions) may be used either alone or in combination.

The dose may be appropriately determined depending on the application (usage) of the resulting formed article (e.g., gas barrier capability and transparency required for the application), and the like.

The ion implantation method is not particularly limited. For example, ions may be implanted into the polysilazane compound/acrylic resin-containing layer (hereinafter may be referred to as "ion implantation target layer") formed in advance.

Ions may be implanted by applying ions (ion beams) accelerated by applying an electric field, or may be implanted by implanting ions present in plasma (plasma ion implantation method), for example. It is preferable to use plasma ion implantation since a formed article that exhibits an excellent gas barrier capability and the like can be conveniently obtained.

The plasma ion implantation method may be implemented by generating plasma in an atmosphere containing a plasma-generating gas, and implanting ions (cations) present in the plasma into the surface area of the ion implantation target layer by applying a negative high-voltage pulse to the ion implantation target layer, for example.

The thickness of an area in which the ion-implanted layer is formed may be controlled by adjusting the implantation conditions (e.g., type of ion, applied voltage, and implantation time), and may be determined depending on the thickness of the ion implantation target layer, the application (usage) of the formed article, and the like. The thickness of an area in which the ion-implanted layer is formed is normally 10 to 1000 nm.

Whether or not ions have been implanted may be determined by performing elemental analysis on an area up to a depth of about 10 nm from the surface using X-ray photoelectron spectroscopy (XPS).

An ion-implanted layer thus obtained exhibits an excellent gas barrier capability since the ion-implanted layer has a significantly low gas (e.g., water vapor) transmission rate as compared with a layer into which ions are not implanted. For example, the water vapor transmission rate of the ion-implanted layer at a temperature of 40° C. and a relative humidity of 90% is normally 1 $g/m^2/day$ or less, preferably 0.5 $g/m^2/day$ or less, and more preferably 0.1 $g/m^2/day$ or less.

The shape of the formed article according to one embodiment of the invention is not particularly limited. For example, the formed article may be in the shape of a film, a sheet, a rectangular parallelepiped, a polygonal prism, a tube, or the like. When using the formed article as an electronic device member (described later), the formed article is preferably in the shape of a film or a sheet. The thickness of the film may be appropriately determined depending on the application of the target electronic device.

The formed article according to one embodiment of the invention may include only the ion-implanted layer, or may also include an additional layer other than the ion-implanted layer. The additional layer may be a single layer, or may include a plurality of identical or different layers.

Examples of the additional layer include a base layer, an inorganic compound layer, an impact-absorbing layer, a conductor layer, a primer layer, and the like.

When the formed article according to one embodiment of the invention is a laminate that also includes the additional layer, the layers may be stacked in an arbitrary order. The ion-implanted layer may be situated at an arbitrary position, but is preferably formed in the surface area of the formed article from the viewpoint of production efficiency and the like. The ion-implanted layer may be formed on one side of the additional layer, or may be formed on each side of the additional layer.

When the formed article according to one embodiment of the invention is a laminate, the thickness of the laminate is not particularly limited, and may be appropriately determined depending on the application of the target electronic device.

Base Layer

A material for forming the base layer is not particularly limited as long as the object of the formed article is not impaired. Examples of the material for forming the base layer include polyimides, polyamides, polyamideimides, polyphenylene ethers, polyether ketones, polyether ether ketones, polyolefins, polyesters, polycarbonates, polysulfones, polyether sulfones, polyphenylene sulfides, polyallylates, acrylic resins, cycloolefin polymers, aromatic polymers, and the like.

Among these, polyesters, polyamides, or cycloolefin polymers are preferable due to excellent transparency and versatility. It is more preferable to use polyesters or cycloolefin polymers.

Examples of the polyesters include polyethylene terephthalate, polybuthylene terephthalate, polyethylene naphthalate, polyallylate, and the like. Examples of the polyamides include wholly aromatic polyamides, nylon 6, nylon 66, nylon copolymers, and the like.

Examples of cycloolefin polymers include norbornene polymers, monocyclic olefin polymers, cyclic conjugated diene polymers, vinyl alicyclic hydrocarbon polymers, and hydrogenated products thereof. Specific examples of the cycloolefin polymers include APEL (ethylene-cycloolefin copolymer manufactured by Mitsui Chemicals Inc.), ARTON (norbornene polymer manufactured by JSR Corporation), ZEONOR (norbornene polymer manufactured by Zeon Corporation), and the like.

Inorganic Compound Layer

The inorganic compound layer is formed of (includes) one or more inorganic compounds. Examples of the inorganic compound that forms the inorganic compound layer include inorganic compounds that can be deposited under vacuum, and exhibit a gas barrier capability, such as inorganic oxides, inorganic nitrides, inorganic carbides, inorganic sulfides, and composites thereof (e.g., inorganic oxynitride, inorganic oxycarbide, inorganic carbonitride, and inorganic oxycarbonitride). Among these, it is preferable to use an inorganic oxide, an inorganic nitride, or an inorganic oxynitride.

Examples of the inorganic oxides include metal oxides represented by MOx.

Note that M represents a metal element. The range of x differs depending on M. For example, $x=0.1$ to 2.0 when M is silicon (Si), $x=0.1$ to 1.5 when M is aluminum (Al), $x=0.1$ to 1.0 when M is magnesium (Mg), $x=0.1$ to 1.0 when M is calcium (Ca), $x=0.1$ to 0.5 when M is potassium (K), $x=0.1$ to 2.0 when M is tin (Sn), $x=0.1$ to 0.5 when M is sodium (Na), $x=0.1$ to 1.5 when M is boron (B), $x=0.1$ to 2.0 when M is titanium (Ti), $x=0.1$ to 1.0 when M is lead (Pb), $x=0.1$ to 2.0 when M is zirconium (Zr), and $x=0.1$ to 1.5 when M is yttrium (Y).

It is preferable to use silicon oxide (M=silicon), aluminum oxide (M=aluminum), or titanium oxide (M=titanium) due to excellent transparency and the like. It is more preferable to use silicon oxide. It is preferable that $x=1.0$ to 2.0 when M is silicon, $x=0.5$ to 1.5 when M is aluminum, and $x=1.3$ to 2.0 when M is titanium.

Examples of the inorganic nitrides include metal nitrides represented by MNy.

Note that M represents a metal element. The range of y differs depending on M. For example, $y=0.1$ to 1.3 when M is silicon (Si), $y=0.1$ to 1.1 when M is aluminum (Al), $y=0.1$ to 1.3 when M is titanium (Ti), and $y=0.1$ to 1.3 when M is tin (Sn).

It is preferable to use silicon nitride (M=silicon), aluminum nitride (M=aluminum), titanium nitride (M=titanium), or tin nitride (M=tin) due to excellent transparency and the like. It is more preferable to use silicon nitride (SiN). It is preferable that $y=0.5$ to 1.3 when M is silicon, $y=0.3$ to 1.0 when M is aluminum, $y=0.5$ to 1.3 when M is titanium, and $y=0.5$ to 1.3 when M is tin.

Examples of the inorganic oxynitride include metal oxynitrides represented by MOxNy.

Note that M represents a metal element. The ranges of x and y differ depending on M. For example, $x=1.0$ to 2.0 and $y=0.1$ to 1.3 when M is silicon (Si), $x=0.5$ to 1.0 and $y=0.1$ to 1.0 when M is aluminum (Al), $x=0.1$ to 1.0 and $y=0.1$ to 0.6 when M is magnesium (Mg), $x=0.1$ to 1.0 and $y=0.1$ to 0.5 when M is calcium (Ca), $x=0.1$ to 0.5 and $y=0.1$ to 0.2 when M is potassium (K), $x=0.1$ to 2.0 and $y=0.1$ to 1.3 when M is tin (Sn), $x=0.1$ to 0.5 and $y=0.1$ to 0.2 when M is sodium (Na), $x=0.1$ to 1.0 and $y=0.1$ to 0.5 when M is boron (B), $x=0.1$ to 2.0 and $y=0.1$ to 1.3 when M is titanium (Ti), $x=0.1$ to 1.0 and $y=0.1$ to 0.5 when M is lead (Pb), $x=0.1$ to 2.0 and $y=0.1$ to 1.0 when M is zirconium (Zr), and $x=0.1$ to 1.5 and $y=0.1$ to 1.0 when M is yttrium (Y).

It is preferable to use silicon oxynitride (M=silicon), aluminum oxynitride (M=aluminum), or titanium oxynitride (M=titanium) due to excellent transparency and the like. It is more preferable to use silicon oxynitride. It is preferable that $x=1.0$ to 2.0 and $y=0.1$ to 1.3 when M is silicon, $x=0.5$ to 1.0 and $y=0.1$ to 1.0 when M is aluminum, and $x=1.0$ to 2.0 and $y=0.1$ to 1.3 when M is titanium.

Note that the metal oxide, the metal nitride, and the metal oxynitride may include two or more types of metals.

The inorganic compound layer may be formed by an arbitrary method. For example, the inorganic compound layer may be formed by deposition, sputtering, ion plating, thermal CVD, plasma CVD, dynamic ion mixing, or the like. Among these, it is preferable to use magnetron sputtering since a laminate that exhibits an excellent gas barrier capability can be conveniently obtained.

The thickness of the inorganic compound layer is not particularly limited, but is preferably 10 to 1000 nm, more preferably 20 to 500 nm, and particularly preferably 50 to 200 nm, from the viewpoint of obtaining a gas barrier capability.

Impact-Absorbing Layer

The impact-absorbing layer prevents occurrence of cracks when an impact is applied to the formed body. A material for forming the impact-absorbing layer is not particularly limited. Examples of the material for forming the impact-absorbing layer include acrylic resins, urethane resins, silicone resins, olefin resins, rubber materials, and the like. Among these, acrylic resins, silicone resins, and rubber materials are preferable.

Examples of the acrylic resins include those mentioned above in connection with the ion-implanted layer.

Examples of the silicone resins include silicone resins that include a dimethylsiloxane as the main component.

Examples of the rubber materials include rubber materials that include isoprene rubber, styrene-butadiene rubber, polyisobutylene rubber, styrene-butadiene-styrene rubber, or the like as the main component.

The impact-absorbing layer may include additives such as an antioxidant, a tackifier, a plasticizer, a UV absorber, a coloring agent, and an antistatic agent.

A product commercially available as a pressure-sensitive adhesive, a coating material, a sealing material, or the like may also be used as the material for fanning the impact-absorbing layer. It is preferable to use a pressure-sensitive adhesive (e.g., acrylic pressure-sensitive adhesive, silicone pressure-sensitive adhesive, or rubber pressure-sensitive adhesive).

The impact-absorbing layer may be formed by an arbitrary method. For example, the impact-absorbing layer may be formed by applying a solution that includes the material (e.g., pressure-sensitive adhesive) for forming the impact-absorbing layer and an optional component (e.g., solvent) to the layer on which the impact-absorbing layer is to be formed, drying the resulting film, and optionally heating the dried film.

Alternatively, the impact-absorbing layer may be deposited on a release base, and transferred to a layer on which the impact-absorbing layer is to be formed.

The thickness of the impact-absorbing layer is normally 1 to 100 µm, and preferably 5 to 50 µm.

Conductor Layer

Examples of a material for forming the conductor layer include metals, alloys, metal oxides, electrically conductive compounds, mixtures thereof, and the like. Specific examples of the material for forming the conductor layer include conductive metal oxides such as antimony-doped tin oxide (ATO), fluorine-doped tin oxide (FTO), tin oxide, zinc oxide, indium oxide, indium tin oxide (ITO), and indium zinc oxide (IZO); metals such as gold, silver, chromium, and nickel; a mixture of a metal and a conductive metal oxide; inorganic conductive substances such as copper iodide and copper sulfide; organic conductive materials such as polyaniline, polythiophene, and polypyrrole; and the like. The conductor layer may be a laminate that includes a plurality of layers formed of these materials.

It is preferable to use a conductive metal oxide (particularly preferably ITO) as the material for forming the conductor layer from the viewpoint of transparency.

The conductor layer may be formed by deposition (evaporation), sputtering, ion plating, thermal CVD, plasma CVD, or the like. It is preferable to form the conductor layer by sputtering since the conductor layer can be conveniently formed.

When forming the conductor layer by sputtering, a discharge gas (e.g., argon) is introduced into a vacuum chamber. A high-frequency voltage or a direct-current voltage is applied between a target and a substrate to generate plasma, and plasma collides against the target so that the target material adheres to the substrate to obtain a thin film. The target is formed of the material for forming the conductor layer.

The thickness of the conductor layer may be appropriately selected depending on the application and the like. The thickness of the conductor layer is normally 10 nm to 50 µm, and preferably 20 nm to 20 µm.

The surface resistivity of the conductor layer is normally 1000 Ω/square or less.

The conductor layer may optionally be patterned. The conductor layer may be patterned by chemical etching (e.g., photolithography), physical etching using a laser or the like, vacuum deposition using a mask, sputtering, a lift-off method, printing, or the like.

Primer Layer

The primer layer improves interlayer adhesion. A formed article that exhibits excellent interlayer adhesion and surface flatness can be obtained by providing the primer layer.

An arbitrary known material may be used to form the primer layer. Examples of the material that may be used to form the primer layer include silicon-containing compounds; a photopolymerizable composition that includes a photopolymerizable compound formed of a photopolymerizable monomer and/or a photopolymerizable prepolymer, and an initiator that generates radicals at least due to visible light; resins such as a polyester resin, a polyurethane resin (particularly a two-component curable resin that includes an isocyanate compound and a polyacryl polyol, a polyester polyol, a polyether polyol, or the like), an acrylic resin, a polycarbonate resin, a vinyl chloride/vinyl acetate copolymer, a polyvinyl butyral resin, and a nitrocellulose resin; alkyl titanates; ethyleneimine; and the like. These materials may be used either alone or in combination.

The primer layer may be formed by dissolving or dispersing the material for forming the primer layer in an appropriate solvent to prepare a primer layer-forming solution, applying the primer layer-forming solution to one side or each side of the layer adjacent to the primer layer, drying the resulting film, and optionally heating the dried film.

The primer layer-forming solution may be applied to one side or each side of the layer adjacent to the primer layer using a wet coating method. Examples of the wet coating method include dipping, roll coating, gravure coating, knife coating, air knife coating, roll knife coating, die coating, screen printing, spray coating, a gravure offset method, and the like.

The film formed by applying the primer layer-forming solution may be dried by hot-air drying, heat roll drying, infrared irradiation, or the like. The thickness of the primer layer is normally 10 to 1000 nm.

Ions may be implanted into the primer layer in the same manner as in the case of forming the ion-implanted layer (described later). A gas barrier film that exhibits a more excellent gas barrier capability can be obtained by implanting ions into the primer layer.

The formed article according to one embodiment of the invention exhibits an excellent gas barrier capability and excellent transparency. When the formed article has a film-like or sheet-like shape (hereinafter referred to as "film-like shape"), it is preferable that the formed article exhibit excellent bending resistance, and maintain its gas barrier capability even when the formed article is bent, for example.

The formed article according to one embodiment of the invention exhibits excellent transparency due to a high visible light transmittance. The visible light transmittance (wavelength: 550 nm) of the formed article is preferably 80% or more. The visible light transmittance of the formed article may be measured using a known visible light transmittance measurement system.

Whether or not the formed article exhibits excellent bending resistance, and maintains its gas barrier capability even when the formed article is bent may be confirmed by bending the film-like formed article, applying pressure to the formed article, determining whether or not the bent area has deteriorated after unbending the formed article, and determining whether or not the water vapor transmission rate has decreased to a large extent. The film-like formed article according to one embodiment of the invention advantageously maintains its gas barrier capability as compared with an inorganic film having an identical thickness even when the formed article is bent.

2) Method for Producing Formed Article

A method for producing a formed article according to one embodiment of the invention includes implanting ions into a polysilazane compound/acrylic resin-containing layer of a formed body that includes the polysilazane compound/acrylic resin-containing layer in its surface area.

In the method for producing a formed article according to one embodiment of the invention, it is preferable to implant ions into a polysilazane compound/acrylic resin-containing layer of a long formed body that includes the polysilazane compound/acrylic resin-containing layer in its surface area while feeding the long formed body in a given direction to produce a formed article.

According to this method, ions can be implanted into a long formed body wound around a feed-out roll while feeding the formed body in a given direction, which can then be wound around a wind-up roll, for example. Therefore, an ion-implanted formed article can be continuously produced.

The long formed body is in the shape of a film. The formed body may include only the polysilazane compound/acrylic resin-containing layer, or may be a laminate that includes the polysilazane compound/acrylic resin-containing layer in its surface area, and further includes an additional layer.

The thickness of the formed body is preferably 0.1 to 500 µm, and more preferably 5 to 300 µm, from the viewpoint of winding/unwinding capability and feeding capability.

Ions may be implanted into the polysilazane compound/acrylic resin-containing layer using an arbitrary method. It is preferable to form an ion-implanted layer in the surface area of the polysilazane compound/acrylic resin-containing layer by a plasma ion implantation method.

The plasma ion implantation method includes applying a negative high-voltage pulse to the formed body that includes the polysilazane compound/acrylic resin-containing layer in its surface area and is exposed to plasma to implant ions present in the plasma into the surface area of the polysilazane compound/acrylic resin-containing layer.

It is preferable to use (A) a plasma ion implantation method that implants ions present in plasma generated by utilizing an external electric field into the surface area of the polysilazane compound/acrylic resin-containing layer, or (B) a plasma ion implantation method that implants ions present in plasma generated due to an electric field produced by applying a negative high-voltage pulse to the polysilazane compound/acrylic resin-containing layer into the surface area of the polysilazane compound/acrylic resin-containing layer.

When using the method (A), it is preferable to set the ion implantation pressure (plasma ion implantation pressure) to 0.01 to 1 Pa. When the ion implantation pressure is within the above range, a uniform ion-implanted layer that exhibits an excellent gas barrier capability and the like can be conveniently and efficiently formed.

The method (B) does not require increasing the degree of decompression, allows a simple operation, and significantly reduces the processing time. Moreover, the entire polysilazane compound/acrylic resin-containing layer can be uniformly processed, and ions present in the plasma can be continuously implanted into the surface area of the polysilazane compound/acrylic resin-containing layer with high energy by applying a negative high-voltage pulse. The method (B) also has an advantage in that an excellent ion-implanted layer can be uniformly formed in the surface area of the polysilazane compound/acrylic resin-containing layer by merely applying a negative high-voltage pulse to the polysilazane compound/acrylic resin-containing layer without requiring a special means such as a high-frequency power supply (e.g., radio frequency (RF) power supply or microwave power supply).

When using the method (A) or (B), the pulse width when applying a negative high-voltage pulse (i.e., during ion implantation) is preferably 1 to 15 µs. When the pulse width is within the above range, a transparent and uniform ion-implanted layer can be formed more conveniently and efficiently.

The voltage applied when generating plasma is preferably −1 to −50 kV, more preferably −1 to −30 kV, and particularly preferably −5 to −20 kV. If the applied voltage is higher than −1 kV, the dose may be insufficient, so that the desired performance may not be obtained. If the applied voltage is lower than −50 kV, the formed article may be electrically charged during ion implantation, or the formed article may be colored, for example.

Examples of a raw material gas that produces plasma ions include those mentioned above in connection with the formed article.

A plasma ion implantation system is used when implanting ions present in plasma into the surface area of the polysilazane compound/acrylic resin-containing layer.

Specific examples of the plasma ion implantation system include (α) a system that causes the ion implantation target layer to be evenly enclosed by plasma by superimposing high-frequency electric power on a feed-through that applies a negative high-voltage pulse to the ion implantation target layer so that ions present in the plasma are attracted to and collide with the target, and thereby implanted and deposited therein (JP-A-2001-26887), (β) a system that includes an antenna in a chamber, wherein high-frequency electric power is applied to generate plasma, and positive and negative pulses are alternately applied to the ion implantation target layer after the plasma has reached an area around the ion implantation target layer, so that ions present in the plasma are attracted to and implanted into the target while heating the ion implantation target layer, causing electrons present in the plasma to be attracted to and collide with the target due to the positive pulse, and applying the negative pulse while controlling the temperature by controlling the pulse factor (JP-A-2001-156013), (γ) a plasma ion implantation system that generates plasma using an external electric field utilizing a high-frequency electric power supply such as a microwave power supply, and causes ions present in the plasma to be attracted to and implanted into the target by applying a high-voltage pulse, (δ) a plasma ion implantation system that implants ions present in plasma generated due to an electric field produced by applying a high-voltage pulse without using an external electric field, and the like.

It is preferable to use the plasma ion implantation system (γ) or (δ) since the plasma ion implantation system (γ) or (δ) allows a simple operation, significantly reduces the processing time, and can be continuously used.

A method that utilizes the plasma ion implantation system (γ) or (δ) is described in detail below with reference to the drawings.

FIG. 1 is a view schematically illustrating a continuous plasma ion implantation system that includes the plasma ion implantation system (γ).

In FIG. 1(a), reference sign 1a indicates a long film-like formed body (hereinafter referred to as "film") that includes a polysilazane compound/acrylic resin-containing layer in its surface area, reference sign 11a indicates a chamber, reference sign 20a indicates a turbo-molecular pump, reference sign 3a indicates a feed-out roll around which the film 1a is wound before ion implantation, reference sign 5a indicates a wind-up roll around which an ion-implanted film (formed article) 1a is wound, reference sign 2a indicates a high-voltage applying rotary can, reference sign 6a indicates a driving roll, reference sign 10a indicates a gas inlet, reference sign 7a indicates a high-voltage pulsed power supply, and reference sign 4a indicates a plasma discharge electrode (external electric field). FIG. 1(b) is a perspective view illustrating the high-voltage applying rotary can 2a, wherein reference sign 15 indicates a high-voltage application terminal (feed-through).

The long film 1a that includes the ion implantation target layer in its surface area is a film in which the polysilazane compound/acrylic resin-containing layer is formed on a base layer.

In the continuous plasma ion implantation system illustrated in FIG. 1(a), the film 1a is fed from the feed-out roll 3a in the direction of an arrow X inside the chamber 11a, passes through the high-voltage applying rotary can 2a, and is wound around the wind-up roll 5a. The film 1a may be wound and fed (carried) by an arbitrary method. In one embodiment of the invention, the film 1a is fed (carried) by rotating the high-voltage applying rotary can 2a at a constant speed. The high-voltage applying rotary can 2a is rotated by rotating a center shaft 13 of the high-voltage application terminal 15 using a motor.

The high-voltage application terminal 15, the driving rolls 6a that come in contact with the film 1a, and the like are formed of an insulator. For example, the high-voltage application terminal 15, the driving rolls 6a, and the like are formed by coating the surface of alumina with a resin (e.g., polytetrafluoroethylene). The high-voltage applying rotary can 2a is formed of a conductor (e.g., stainless steel).

The line (feed) speed of the film 1a may be appropriately set. The line (feed) speed of the film 1a is not particularly limited as long as ions are implanted into the surface area (polysilazane compound/acrylic resin-containing layer) of the film 1a so that the desired ion-implanted layer is formed when the film 1a is fed from the feed-out roll 3a and wound around the wind-up roll 5a. The film winding speed (line (feed) speed) is determined depending on the applied voltage, the size of the system, and the like, but is normally 0.1 to 3 m/min, and preferably 0.2 to 2.5 m/min.

The pressure inside the chamber 11a is reduced by discharging air from the chamber 11a using the turbo-molecular pump 20a connected to a rotary pump. The degree of decompression is normally $1 \times 10^{-4}$ to 1 Pa, and preferably $1 \times 10^{-3}$ to $1 \times 10^{-2}$ Pa.

An ion implantation gas is introduced into the chamber 11a through the gas inlet 10a so that the chamber 11a is filled with the ion implantation gas under reduced pressure. Note that the ion implantation gas also serves as a plasma-generating gas.

Plasma is then generated using the plasma discharge electrode 4 (external electric field). The plasma may be generated by a known method using a high-frequency electric power supply (e.g., microwave power supply or RF power supply).

A negative high-voltage pulse 9a is applied from the high-voltage pulsed power supply 7a connected to the high-voltage applying rotary can 2a through the high-voltage application terminal 15. When a negative high-voltage pulse is applied to the high-voltage applying rotary can 2a, ions present in the plasma are attracted to and implanted into the surface of the film around the high-voltage applying rotary can 2a (arrow Y in FIG. 1(a)), so that a film-like formed article 1b is obtained.

The pressure during ion implantation (i.e., the pressure of plasma gas inside the chamber 11a) is preferably 0.01 to 1 Pa. The pulse width during ion implantation is preferably 1 to 15 μs. The negative high-voltage applied to the high-voltage applying rotary can 2a is preferably −1 to −50 kV.

When using a continuous plasma ion implantation system illustrated in FIG. 2, ions are implanted into a polysilazane compound/acrylic resin-containing layer of a film that includes the polysilazane compound/acrylic resin-containing layer in its surface area as described below.

Figure 2:
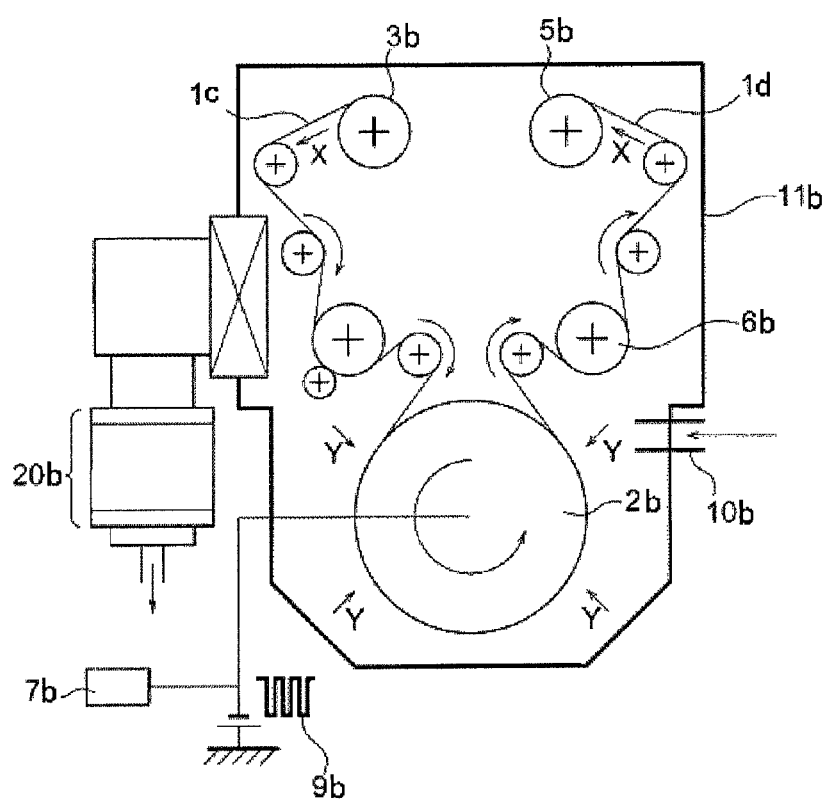
FIG. 2 is a view illustrating a schematic configuration of a plasma ion implantation system.

The system illustrated in FIG. 2 includes the plasma ion implantation system (δ). The plasma ion implantation system (δ) generates plasma by applying only an electric field due to a high-voltage pulse without using an external electric field (i.e., the plasma discharge electrode 4 illustrated in FIG. 1).

In the continuous plasma ion implantation system illustrated in FIG. 2, a film 1c (film-like formed body) is fed from a feed-out roll 3b in the direction of an arrow X (see FIG. 2) by rotating a high-voltage applying rotary can 2b, and wound around a wind-up roll 5b.

The continuous plasma ion implantation system illustrated in FIG. 2 implants ions into the surface area of the polysilazane compound/acrylic resin-containing layer of the film as described below.

The film 1c is placed in a chamber 11b in the same manner as the plasma ion implantation system illustrated in FIG. 1. The pressure inside the chamber 11b is reduced by discharging air from the chamber 11b using a turbo-molecular pump 20b connected to a rotary pump. An ion implantation gas is introduced into the chamber 11b through a gas inlet 10b so that the chamber 11b is filled with the ion implantation gas under reduced pressure.

The pressure during ion implantation (i.e., the pressure of plasma gas inside the chamber 11b) is 10 Pa or less, preferably 0.01 to 5 Pa, and more preferably 0.01 to 1 Pa.

A high-voltage pulse 9b is applied from a high-voltage pulsed power supply 7b connected to the high-voltage applying rotary can 2b through a high-voltage application terminal (not shown) while feeding the film 1c in the direction of the arrow X illustrated in FIG. 2.

When a negative high-voltage pulse is applied to the high-voltage applying rotary can 2b, plasma is generated along the film 1c positioned around the high-voltage applying rotary can 2b, and ions present in the plasma are attracted to and implanted into the surface of the film 1c around the high-voltage applying rotary can 2b (arrow Y in FIG. 2). When ions have been implanted into the surface area of the polysilazane compound/acrylic resin-containing layer of the film 1c, an ion-implanted layer is formed in the surface area of the film. A film-like formed article 1d is thus obtained.

The applied voltage and the pulse width employed when applying a negative high-voltage pulse to the high-voltage applying rotary can 2b, and the pressure employed during ion implantation are the same as those employed when using the continuous plasma ion implantation system illustrated in FIG. 1.

Since the plasma ion implantation system illustrated in FIG. 2 is configured so that the high-voltage pulsed power supply also serves as a plasma generation means, a special means such as a high-frequency electric power supply (e.g., RF power supply or microwave power supply) is unnecessary. An ion-implanted layer can be continuously formed by implanting ions present in the plasma into the surface area of the polysilazane compound/acrylic resin-containing layer by merely applying a negative high-voltage pulse. Therefore, a formed article in which an ion-implanted layer is formed in the surface area of a film can be mass-produced.

3) Electronic Device Member and Electronic Device

An electronic device member according to one embodiment of the invention includes the formed article according to one embodiment of the invention. Therefore, since the electronic device member according to one embodiment of the invention exhibits an excellent gas barrier capability, a deterioration in an element (member or device) due to gas (e.g., water vapor) can be prevented. Since the electronic device member exhibits high light transmittance, the electronic device member may suitably be used as a display member for liquid crystal displays or electroluminescence displays; a solar cell backsheet; and the like.

An electronic device according to one embodiment of the invention includes the electronic device member according to one embodiment of the invention. Specific examples of the electronic device include a liquid crystal display, an organic EL display, an inorganic EL display, electronic paper, a solar cell, and the like.

Since the electronic device according to one embodiment of the invention includes the electronic device member that includes the formed article according to one embodiment of the invention, the electronic device exhibits an excellent gas barrier capability and excellent transparency.

EXAMPLES

The invention is further described below by way of examples. Note that the invention is not limited to the following examples.

Note that PMMA refers to poly(methyl methacrylate) that is a homopolymer of methyl methacrylate.

The following plasma ion implantation system, water vapor transmission rate measurement system, water vapor transmission rate measurement conditions, visible light transmittance measurement system, bending test method, and gas barrier layer (surface layer part) XPS elemental analysis system were used in the examples. Note that a system that implants ions using an external electric field was used as the plasma ion implantation system.

XPS Elemental Analysis

The content rate of each atom in the surface layer part of the gas barrier layer was measured under the following conditions using an X-ray photoelectron spectroscopy (XPS).
Measurement system: "PHI Quantera SXM" manufactured by ULVAC-PHI, Incorporated
X-ray source: AlKα
X-ray beam diameter: 100 μm
Power: 25 W
Voltage: 15 kV
Take-off angle: 45°
Degree of vacuum: $5.0 \times 10^{-8}$ Pa
Plasma Ion Implantation System
RF power supply: "RF56000" manufactured by JEOL Ltd.
High-voltage pulsed power supply: "PV-3-HSHV-0835" manufactured by Kurita Seisakusho Co., Ltd.
Measurement of Water Vapor Transmission Rate The water vapor transmission rate was measured using a transmission rate tester "L89-500" (manufactured by LYSSY) (when the water vapor transmission rate was 0.01 g/m²/day or more) or "DELTAPERM" (manufactured by Technolox Ltd.) (when the water vapor transmission rate was less than 0.01 g/m²/day).
Measurement conditions: relative humidity: 90%, temperature: 40° C.
Measurement of Visible Light Transmittance and Haze
Visible light transmittance measurement system: "UV-3101PC" manufactured by Shimadzu Corporation
Measurement wavelength: 550 nm Bending Test The formed article was bent at the center so that the ion-implanted layer (ion-implanted side) (the surface of the perhydropolysilazane-containing layer in Comparative Example 1, and the surface of the silicon nitride film in Comparative Example 4) was positioned on the outer side. The formed article was passed between two rolls of a laminator ("LAMIPACKER LPC1502" manufactured by Fujipla, Inc.) at a laminating speed of 5 m/min and a temperature of 23° C. The bent area was observed using a microscope (magnification: 100) to determine the presence or absence of cracks. A case where cracks were not observed is indicated by "None", and a case where cracks were observed is indicated by "Occurred".

The water vapor transmission rate of the formed article was measured before and after the bending test.
Measurement of Coating Liquid Stability A case where the mixture containing perhydropolysilazane and a resin gelled within 6 hours after the preparation (i.e., a film could not be formed) was evaluated as "Unstable", and a case where the mixture did not gel (i.e., a film could be fowled) was evaluated as "Stable".

Example 1

A mixture prepared by mixing a coating material containing perhydropolysilazane (polysilazane compound) as the main component ("Aquamika NL110-20" manufactured by Clariant Japan K.K.), with a dioxane solution of PMMA (manufactured by Aldrich, Mw: 120,000) (acrylic resin) was applied to a polyethylene terephthalate film ("PET38 T-100" manufactured by Mitsubishi Plastics Inc., thickness: 38 μm (hereinafter referred to as "PET film")) (base layer), and heated at 120° C. for 2 minutes to form a perhydropolysilazane/PMMA-containing layer (thickness: 150 nm) on the PET film. A formed body was thus obtained.

The content of PMMA was 0.1 mass % based on the total solid content (i.e., the total content of polysilazane compound and acrylic resin) (=100 mass %) (i.e., PMMA:perhydropolysilazane=0.1:99.9 (mass ratio)).

Argon (Ar) was plasma-ion-implanted into the surface of the perhydropolysilazane/PMMA-containing layer of the formed body under the following conditions using the plasma ion implantation system illustrated in FIG. 1 to obtain a formed article 1.
Plasma Ion Implantation Conditions
Plasma-generating gas: argon
Gas flow rate: 100 sccm
Duty ratio: 0.5%
Repetition frequency: 1000 Hz
Applied voltage: −10 kV
RF power supply: frequency: 13.56 MHz, applied electric power: 1000 W
Chamber internal pressure: 0.2 Pa
Pulse width: 5 μs
Processing time (ion implantation time): 5 min
Line (feed) speed: 0.2 m/min Example 2

A formed article 2 was obtained in the same manner as in Example 1, except that the content of PMMA was changed to 1 mass % based on the total solid content (i.e., PMMA:perhydropolysilazane=1:99 (mass ratio)).

Example 3

A formed article 3 was obtained in the same manner as in Example 1, except that the content of PMMA was changed to 10 mass % based on the total solid content (i.e., PMMA: perhydropolysilazane=10:90 (mass ratio)).

Example 4

A formed article 4 was obtained in the same manner as in Example 1, except that the content of PMMA was changed to 30 mass % based on the total solid content (i.e., PMMA: perhydropolysilazane=30:70 (mass ratio)).

Example 5

A formed article 5 was obtained in the same manner as in Example 1, except that the content of PMMA was changed to 40 mass % based on the total solid content (i.e., PMMA: perhydropolysilazane=40:60 (mass ratio)).

Example 6

A formed article 6 was obtained in the same manner as in Example 1, except that the content of PMMA was changed to 50 mass % based on the total solid content (i.e., PMMA: perhydropolysilazane=50:50 (mass ratio)).

Example 7

A formed article 7 was obtained in the same manner as in Example 1, except that the content of PMMA was changed to 60 mass % based on the total solid content (i.e., PMMA: perhydropolysilazane=60:40 (mass ratio)).

Example 8

A formed article 8 was obtained in the same manner as in Example 1, except that the content of PMMA was changed to 70 mass % based on the total solid content (i.e., PMMA: perhydropolysilazane=70:30 (mass ratio)).

Example 9

A formed article 17 was obtained in the same manner as in Example 6, except that poly(isobutyl methacrylate) (manufactured by Aldrich, Mw: 130,000) was used instead of PMMA.

Example 10

A formed article 18 was obtained in the same manner as in Example 6, except that poly(cyclohexyl methacrylate) (manufactured by Aldrich, Mw: 65,000) was used instead of PMMA.

Comparative Example 1

A formed article was obtained in the same manner as in Example 6, except that ion implantation was not performed. Specifically, a formed article 9 was obtained by forming a perhydropolysilazane/PMMA-containing layer on the PET film.

Comparative Example 2

A formed article was obtained in the same manner as in Example 1, except that perhydropolysilazane was not used. Specifically, a formed article 10 was obtained in the same manner as in Example 1, except that the content of PMMA was changed to 100 mass % based on the total solid content (i.e., PMMA:perhydropolysilazane=100:0 (mass ratio)).

Comparative Example 3

A formed article was obtained in the same manner as in Example 1, except that the perhydropolysilazane/PMMA-containing layer was not formed on the PET film. Specifically, a formed article 11 was obtained by plasma ion implantation of argon (Ar) into the surface of the PET film under the same conditions as those employed in Example 1.

Comparative Example 4

A silicon nitride (SiN) film (thickness: 60 nm) was formed on a PET film by sputtering to obtain a formed article 12.

Comparative Example 5

A formed article 13 was obtained in the same manner as in Example 6, except that a polyurethane (resin A: "Pandex T5265M" manufactured by DIC Corporation) was used instead of PMMA.

Comparative Example 6

A formed article 14 was obtained in the same manner as in Example 6, except that a polyethylene (resin B: "Kernel KJ640T" manufactured by Japan Polyethylene Corporation) was used instead of PMMA.

Comparative Example 7

A formed article 15 was obtained in the same manner as in Example 6, except that a polycarbonate (resin C: manufactured by Aldrich) was used instead of PMMA.

Reference Example 1

A formed article was obtained in the same manner as in Example 1, except that PMMA was not used. Specifically, a formed article 16 was obtained in the same manner as in Example 1, except that the content of PMMA was changed to 0 mass % based on the total solid content (i.e., PMMA: perhydropolysilazane=0:100 (mass ratio)).

The content of the acrylic resin (mass %) (indicated by "%" in Table 1) in the formed articles 1 to 18 obtained in Examples 1 to 10, Comparative Examples 1 to 7, and Reference Example 1, the ion species used for ion implantation (see "Ion implantation" in Table 1), and the thickness (nm) of the layer formed on the PET film are shown in Table 1. Note that "Note 1" (Comparative Example 4) in Table 1 indicates that a silicon nitride (SiN) film (thickness: 60 nm) was formed on a PET film by sputtering to obtain the formed article 12.

The formed articles 1 to 8, 10, 11, 16, 17, and 18 obtained in Examples 1 to 10, Comparative Examples 2 and 3, and Reference Example 1 were subjected to elemental analysis in an area up to a depth of about 10 nm from the surface using an X-ray photoelectron spectrometer (manufactured by ULVAC-PHI, Incorporated). It was confirmed that ions had been implanted into the formed articles 1 to 8, 10, 11, 16, 17, and 18. The results are shown in Table 1. In Table 1, the carbon atom content rate (%), the nitrogen atom content rate (%), the oxygen atom content rate (%), and the silicon atom content rate (%) in the surface layer par of the gas barrier layer refers to the content rate based on the total content rate (=100%) of carbon atoms, nitrogen atoms, oxygen atoms, and silicon atoms.

TABLE 1

| | Formed article | Content rate (%) | | | | Acrylic resin content (%) | Ion implantation | Thickness (nm) of layer formed on PET film |
|---|---|---|---|---|---|---|---|---|
| | | Carbon atom | Nitrogen atom | Oxygen atom | Silicon atom | | | |
| Example 1 | 1 | 12.57 | 4.48 | 56.5 | 26.45 | 0.1 | Ar | 150 |
| Example 2 | 2 | 11.12 | 3.48 | 58.33 | 27.07 | 1 | Ar | 150 |
| Example 3 | 3 | 10.03 | 3.64 | 59.86 | 26.47 | 10 | Ar | 150 |
| Example 4 | 4 | 10.21 | 3.91 | 58.45 | 27.43 | 30 | Ar | 150 |
| Example 5 | 5 | 11.35 | 3.65 | 58.41 | 26.59 | 40 | Ar | 150 |
| Example 6 | 6 | 9.45 | 1.16 | 63.42 | 25.97 | 50 | Ar | 150 |
| Example 7 | 7 | 10.32 | 2.76 | 61.45 | 25.47 | 60 | Ar | 150 |
| Example 8 | 8 | 11.17 | 3.05 | 60.84 | 24.94 | 70 | Ar | 150 |
| Example 9 | 17 | 10.42 | 2.97 | 61.23 | 25.38 | 50 | Ar | 150 |
| Example 10 | 18 | 10.56 | 2.61 | 62.54 | 24.29 | 50 | Ar | 150 |
| Comparative Example 1 | 9 | 50.63 | 10.24 | 21.29 | 17.84 | 50 | — | 150 |
| Comparative Example 2 | 10 | 86.47 | 1.12 | 12.41 | 0.00 | 100 | Ar | 150 |
| Comparative Example 3 | 11 | — | — | — | — | 0 (only PET) | Ar | 0 |
| Comparative Example 4 | 12 | 0.00 | 0.01 | 64.78 | 2.30 | 0 (SiN film) | — (Note 1) | 60 |
| Comparative Example 5 | 13 | — | — | — | — | 0 (resin A: 50%) | Ar | 150 |
| Comparative Example 6 | 14 | — | — | — | — | 0 (resin B: 50%) | Ar | 150 |
| Comparative Example 7 | 15 | — | — | — | — | 0 (resin C: 50%) | Ar | 150 |
| Reference Example 1 | 16 | 0.00 | 5.36 | 63.10 | 31.54 | 0 | Ar | 150 |

Coating Liquid Stability Test

The mixtures containing perhydropolysilazane and the resin prepared in Examples 1 to 10, Comparative Examples 1, 2, and 5 to 7, and Reference Example 1 were subjected to a coating liquid stability test. The results are shown in Table 2.

Measurement of Total Light Transmittance and Haze

The total light transmittance and the haze of the formed articles 1 to 12, 14, 16, 17, and 18 obtained in Examples 1 to 10, Comparative Examples 1 to 4 and 6, and Reference Example 1 were measured. The results are shown in Table 2.

Bending Test

The formed articles 1 to 12, 14, 16, 17, and 18 were also subjected to a bending test to determine the presence or absence of cracks. The results are shown in Table 2.

Water Vapor Transmission Rate

The water vapor transmission rate (g/m²/day) of the formed articles 1 to 12, 14, 16, 17, and 18 was measured before and after the bending test. The results are shown in Table 2.

TABLE 2

| | Formed article | Water vapor transmission rate (g/m²/day) before bending test | Visible light transmittance (%) | Haze (%) | After bending test | | Coating liquid stability |
|---|---|---|---|---|---|---|---|
| | | | | | Cracks | Water vapor transmission rate (g/m²/day) | |
| Example 1 | 1 | 0.01 | 82 | 0.32 | None | 0.36 | Stable |
| Example 2 | 2 | 0.01 | 82 | 0.33 | None | 0.23 | Stable |
| Example 3 | 3 | 0.01 | 86 | 0.35 | None | 0.19 | Stable |
| Example 4 | 4 | 0.04 | 86 | 0.34 | None | 0.22 | Stable |
| Example 5 | 5 | 0.04 | 86 | 0.32 | None | 0.22 | Stable |
| Example 6 | 6 | 0.04 | 86 | 0.31 | None | 0.12 | Stable |
| Example 7 | 7 | 0.04 | 86 | 0.32 | None | 0.12 | Stable |
| Example 8 | 8 | 0.50 | 86 | 0.31 | None | 0.70 | Stable |
| Example 9 | 17 | 0.04 | 86 | 0.33 | None | 0.11 | Stable |
| Example 10 | 18 | 0.04 | 86 | 0.32 | None | 0.12 | Stable |
| Comparative Example 1 | 9 | 12.32 | 92 | 0.36 | None | 12.43 | Stable |
| Comparative Example 2 | 10 | 0.53 | 72 | 0.40 | None | 0.88 | Stable |
| Comparative Example 3 | 11 | 7.98 | 82 | 0.40 | None | 8.07 | — |
| Comparative Example 4 | 12 | 0.25 | 71 | 0.38 | Occurred | 1.6 | — |
| Comparative Example 5 | 13 | — | — | — | — | — | Unstable |
| Comparative Example 6 | 14 | 0.52 | 80 | 10.4 | None | 0.78 | Stable |

TABLE 2-continued

|  | Formed article | Water vapor transmission rate (g/m²/day) before bending test | Visible light transmittance (%) | Haze (%) | After bending test | | Coating liquid stability |
|---|---|---|---|---|---|---|---|
|  |  |  |  |  | Cracks | Water vapor transmission rate (g/m²/day) |  |
| Comparative Example 7 | 15 | — | — | — | — | — | Unstable |
| Reference Example 1 | 16 | 0.01 | 87 | 0.32 | None | 0.22 | Stable |

As shown in Table 2, the mixtures containing perhydropolysilazane and the resin prepared in Examples 1 to 10 exhibited excellent coating liquid stability, and the formed articles 1 to 8, 17, and 18 obtained in Examples 1 to 10 had a low water vapor transmission rate (i.e., exhibited an excellent gas barrier capability) as compared with the formed articles 9 to 11 and 14 obtained in Comparative Examples 1 to 3 and 6. The formed articles 1 to 8, 17, and 18 had high visible light transmittance and a small haze value (i.e., exhibited excellent transparency). In Comparative Examples 5 and 7, a formed article could not be obtained due to poor coating liquid stability.

The formed articles 1 to 8, 17, and 18 obtained in Examples 1 to 10 showed no cracks, and maintained a small water vapor transmission rate after being subjected to the bending test (i.e., exhibited excellent bending resistance).

REFERENCE SIGNS LIST 1a, 1c: film-like formed body
1b, 1d: film-like formed article
2a, 2b: rotary can
3a, 3b: feed-out roll
4: plasma discharge electrode
5a, 5b: wind-up roll
6a, 6b: driving roll
7a, 7b: pulsed power supply
9a, 9b: high-voltage pulse
10a, 10b: gas inlet
11a, 11b: chamber
13: center shaft
15: high-voltage application terminal
20a, 20b: turbo-molecular pump

The invention claimed is:

1. A formed article comprising a base layer and a gas barrier layer,
wherein the formed article has a thickness of 5 to 300 μm, and has a water vapor transmission rate at a temperature of 40° C. and a relative humidity of 90% of 0.1 g/m²/day or less;
wherein the gas barrier layer:
includes a surface layer part in the area of 0-10 nm in depth from the surface that is formed of a material that includes at least a carbon atom, an oxygen atom, and a silicon atom, the surface layer part having a carbon atom content rate of more than 0 and not more than to 70%, an oxygen atom content rate of 10 to 70%, a nitrogen atom content rate of 1.16 to 35%, and a silicon atom content rate of 20 to 55%, based on a total content rate of carbon atoms, oxygen atoms, nitrogen atoms, and silicon atoms,
includes a polysilazane compound and an acrylic resin, wherein the weight average molecular weight of the acrylic resin is 100,000-1,000,000; wherein the acrylic resin is selected from the group consisting of (i) a homopolymer of a (meth)acrylic acid-based compound, (ii) a copolymer of two or more (meth) acrylic acid-based compounds, and (iii) a copolymer of a (meth)acrylic acid-based compound and an additional functional monomer; wherein when the acrylic resin is the copolymer (iii) the content of a repeating unit derived from a (meth)acrylic acid-based compound in the acrylic resin is 50 mol % or more based on the total repeating units in the acrylic resin; wherein a total content of the polysilazane compound and the acrylic resin in the gas barrier layer is 70 mass % or more;
has an acrylic resin content of 50 to 60 mass % based on a total content of the polysilazane compound and the acrylic resin, and
includes a layer that is obtained by implanting ions into a layer that includes the polysilazane compound and the acrylic resin, the ions being obtained by ionizing at least one gas selected from the group consisting of argon, helium, neon, xenon, krypton in the absence of oxygen ion or nitrogen ion, and implanted into the layer that includes the polysilazane compound and the acrylic resin having a thickness of 30-500 nm by a plasma ion implantation method,
the material for forming the base layer being at least one polymer selected from the group consisting of polyimides, polyamides, polyamideimides, polyphenylene ethers, polyether ketones, polyether ether ketones, polyolefins, polyesters, polycarbonates, polysulfones, polyether sulfones, polyphenylene sulfides, polyallylates, acrylic resins, cycloolefin polymers, and aromatic resin polymers.

2. The formed article according to claim 1, wherein the surface layer part has the carbon atom content rate of 9.45 to 10.56%, oxygen atom content rate of 61.23 to 63.42%, nitrogen atom content rate of 1.16 to 2.97%, and silicon atom content rate of 24.29 to 25.97%, based on a total content rate of carbon atoms, oxygen atoms, nitrogen atoms, and silicon atoms.

3. An electronic device member comprising the formed article according to claim 1.

4. An electronic device comprising the electronic device member according to claim 3.

5. A method for producing the formed article according to claim 1, the method comprising a step of implanting ions into a surface area of a layer that is included in a formed body and includes a polysilazane compound and an acrylic resin, the formed body including the layer that includes the polysilazane compound and the acrylic resin in its surface area, the ions being at least one gas selected from the group consisting of argon, helium, xenon, neon, and krypton in the absence of oxygen ion or nitrogen ion.

6. A method for producing the formed article according to claim 5, the method comprising implanting ions into a layer that is included in a long formed body and includes a polysilazane compound and an acrylic resin while feeding the formed body in a given direction, the formed body including the layer that includes the polysilazane compound and the acrylic resin in its surface area.

* * * * *